(12) United States Patent
Tsuzuki et al.

(10) Patent No.: US 8,841,699 B2
(45) Date of Patent: *Sep. 23, 2014

(54) SEMICONDUCTOR DEVICE INCLUDING INSULATED GATE BIPOLAR TRANSISTOR AND DIODE

(75) Inventors: Yukio Tsuzuki, Nukata-gun (JP); Hiromitsu Tanabe, Nukata-gun (JP); Kenji Kouno, Gifu (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/495,051

(22) Filed: Jun. 13, 2012

(65) Prior Publication Data
US 2012/0319163 A1 Dec. 20, 2012

(30) Foreign Application Priority Data

Jun. 15, 2011 (JP) ................................. 2011-133233
Apr. 25, 2012 (JP) ................................. 2012-100057

(51) Int. Cl.
H01L 29/04 (2006.01)
H01L 29/10 (2006.01)
H01L 29/66 (2006.01)
H01L 29/739 (2006.01)
H01L 29/861 (2006.01)
H01L 29/32 (2006.01)
H01L 21/263 (2006.01)

(52) U.S. Cl.
CPC .......... *H01L 21/263* (2013.01); *H01L 29/7397* (2013.01); *H01L 29/861* (2013.01); *H01L 29/32* (2013.01); *H01L 29/1095* (2013.01)
USPC ........... 257/140; 257/138; 257/139; 257/156; 257/142; 257/490

(58) Field of Classification Search
USPC .................. 257/138–140, 142, 156, 368, 490
See application file for complete search history.

(56) References Cited

U.S. PATENT DOCUMENTS 5,162,876 A * 11/1992 Kitagawa et al. ............. 257/138
6,177,713 B1 * 1/2001 Aono et al. ................... 257/490
(Continued)

FOREIGN PATENT DOCUMENTS

JP    04-346477 A    12/1992
JP    2007-258363 A    10/2007
(Continued)

OTHER PUBLICATIONS

Office Action mailed May 7, 2013 in corresponding JP patent application No. 2012-100057 (and English translation).

(Continued)

*Primary Examiner* — Fernando L Toledo
*Assistant Examiner* — Mohammed Shamsuzzaman
(74) *Attorney, Agent, or Firm* — Posz Law Group, PLC

(57) ABSTRACT

A semiconductor device includes an IGBT forming region and a diode forming region. The IGBT forming region includes an IGBT operating section that operates as an IGBT and a thinned-out section that does not operate as an IGBT. The IGBT operating section includes a channel region, and the thinned-out section includes a first anode region. The diode forming region includes a second anode region. When an area density is defined as a value calculated by integrating a concentration profile of second conductivity type impurities in each of the channel region, the first anode region, and the second anode region in a depth direction, an area density of the channel region is higher than an area density of the first anode region and an area density of the second anode region.

6 Claims, 16 Drawing Sheets

(56) References Cited

U.S. PATENT DOCUMENTS

| | | | | |
|---|---|---|---|---|
| 6,605,830 B1* | 8/2003 | Kusunoki | | 257/156 |
| 8,405,122 B2* | 3/2013 | Kouno et al. | | 257/139 |
| 2005/0045960 A1* | 3/2005 | Takahashi | | 257/368 |
| 2007/0200138 A1* | 8/2007 | Ozeki et al. | | 257/139 |
| 2009/0001411 A1* | 1/2009 | Tokura et al. | | 257/140 |
| 2009/0008674 A1* | 1/2009 | Udrea | | 257/138 |
| 2009/0315070 A1* | 12/2009 | Yoshikawa | | 257/139 |
| 2010/0039844 A1* | 2/2010 | Arai et al. | | 363/131 |
| 2010/0090248 A1* | 4/2010 | Kouno | | 257/140 |
| 2011/0042715 A1* | 2/2011 | Tsukuda et al. | | 257/139 |
| 2011/0193132 A1* | 8/2011 | Kouno et al. | | 257/139 |
| 2012/0043581 A1* | 2/2012 | Koyama et al. | | 257/140 |
| 2012/0080718 A1* | 4/2012 | Soeno | | 257/140 |
| 2012/0193676 A1* | 8/2012 | Bobde et al. | | 257/140 |
| 2012/0217541 A1* | 8/2012 | Hsieh | | 257/140 |
| 2012/0286326 A1* | 11/2012 | Yoshikawa | | 257/142 |
| 2013/0001638 A1* | 1/2013 | Yoshikawa | | 257/139 |
| 2013/0001639 A1* | 1/2013 | Iwasaki et al. | | 257/140 |
| 2013/0037853 A1* | 2/2013 | Onozawa | | 257/139 |
| 2013/0075784 A1* | 3/2013 | Ikeda | | 257/140 |
| 2013/0248924 A1* | 9/2013 | Matsudai et al. | | 257/139 |

FOREIGN PATENT DOCUMENTS

| | | |
|---|---|---|
| JP | 2008300528 A * | 12/2008 |
| JP | A-2008-300528 | 12/2008 |
| JP | 2010-267863 A | 11/2010 |

OTHER PUBLICATIONS

Office Action mailed Mar. 4, 2014 issued in corresponding JP patent application No. 2012-100057 (and English translation).

Office Action mailed Jun. 11, 2014 issued in corresponding CN patent application No. 2012 1020 1479.6 (and English translation).

* cited by examiner

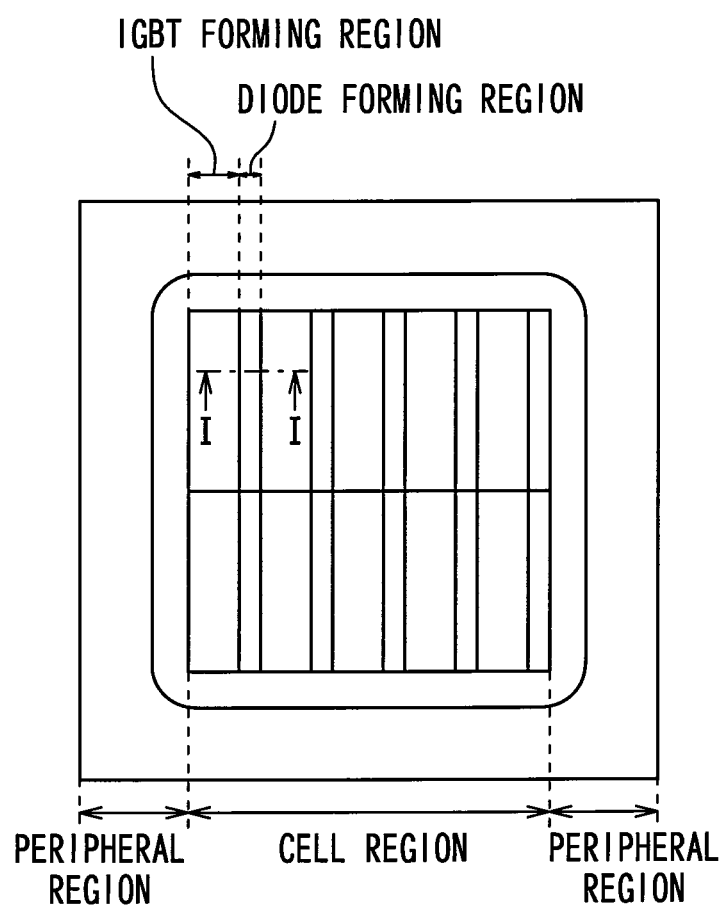

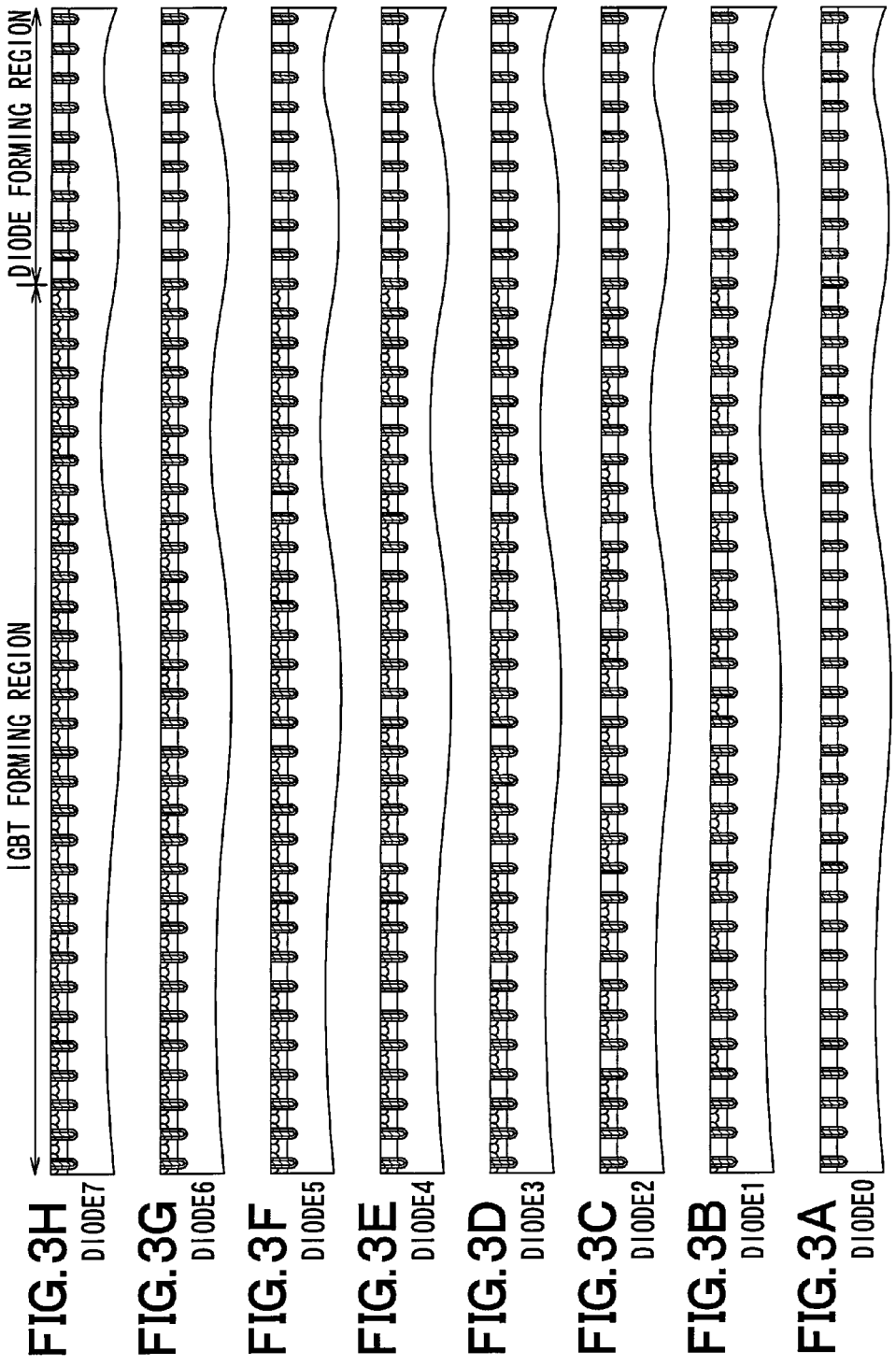

SEMICONDUCTOR DEVICE INCLUDING INSULATED GATE BIPOLAR TRANSISTOR AND DIODE

CROSS REFERENCE TO RELATED APPLICATIONS

The present application is based on and claims priority to Japanese Patent Applications No. 2011-133233 filed on Jun. 15, 2011 and No. 2012-100057 filed on Apr. 25, 2012, the contents of which are incorporated in their entirety herein by reference.

TECHNICAL FIELD

The present disclosure relates to a semiconductor device including an insulated gate bipolar transistor (IGBT) and a diode disposed in the same semiconductor substrate.

BACKGROUND

Conventionally, an inverter circuit for converting direct current to alternating current includes a semiconductor device in which an IGBT operating as a switching element and a free wheel diode (FWD) are integrated in the same chip, as described, for example, in JP-A-2007-227806 (corresponding to US 2007/200138 A). The semiconductor device converts direct current to alternating current by turning on and off the IGBT. When the IGBT is turned off, electric current that flows to a load (e.g., a motor) through the FWD flows back.

SUMMARY

It is an object of the present disclosure to provide a semiconductor device that includes an IGBT forming region and a diode forming region and can reduce a carrier implantation amount to improve a recovery property.

A semiconductor device according to an aspect of the present disclosure includes an IGBT forming region and a diode forming region disposed along the IGBT forming region. The IGBT forming region includes a vertical IGBT and the diode forming region including a diode. The semiconductor device includes a drift layer of a first conductivity type, a collector region of a second conductivity type, a cathode region of the first conductivity type, a second conductivity type region, a plurality of trenches, an emitter region of the first conductivity type, a gate insulating layer, a gate electrode, an upper electrode, and a lower electrode.

The drift layer has a first surface and a second surface. The collector region is disposed to the second surface of the drift layer in the IGBT forming region. The cathode region is disposed to the second surface of the drift layer in the diode forming region. The second conductivity type region is disposed to the first surface of the drift layer in both of the IGBT forming region and the diode forming region. The trenches extend to a depth deeper than the second conductivity type region. The trenches divide the second conductivity type region in the IGBT forming region into a plurality of regions including a channel region and a first anode region. The emitter region is disposed at a surface portion of the channel region along sidewalls of the trenches in the IGBT forming region. The gate insulating layer is disposed on surfaces of the trenches. The gate electrode is disposed on a surface of the gate insulating layer. The upper electrode is electrically coupled with the second conductivity type region in the IGBT forming region including the channel region and the first anode region. The upper electrode is further electrically coupled with the second conductivity type region in the diode forming region which operates as a second anode region. The lower electrode is electrically coupled with the collector region in the IGBT forming region and the cathode region in the diode forming region.

In the IGBT forming region, a section including the channel region is an IGBT operating section that operates as the vertical IGBT, and a section including the first anode region is a thinned-out section that does not operate as the vertical IGBT. When an area density is defined as a value calculated by integrating a concentration profile of second conductivity type impurities in the second conductivity type region in a depth direction, an area density of the channel region is higher than an area density of the first anode region and an area density of the second anode region.

The semiconductor device can reduce the amount of carrier implantation from the diode forming region and can improve a recovery property.

BRIEF DESCRIPTION OF THE DRAWINGS

Additional objects and advantages of the present disclosure will be more readily apparent from the following detailed description when taken together with the accompanying drawings. In the drawings:

FIG. 2 is a top view of the semiconductor device according to the first embodiment;

FIG. 3A to FIG. 3H are diagrams showing cross-sectional models of semiconductor devices used in a simulation;

DETAILED DESCRIPTION

Figure 16:
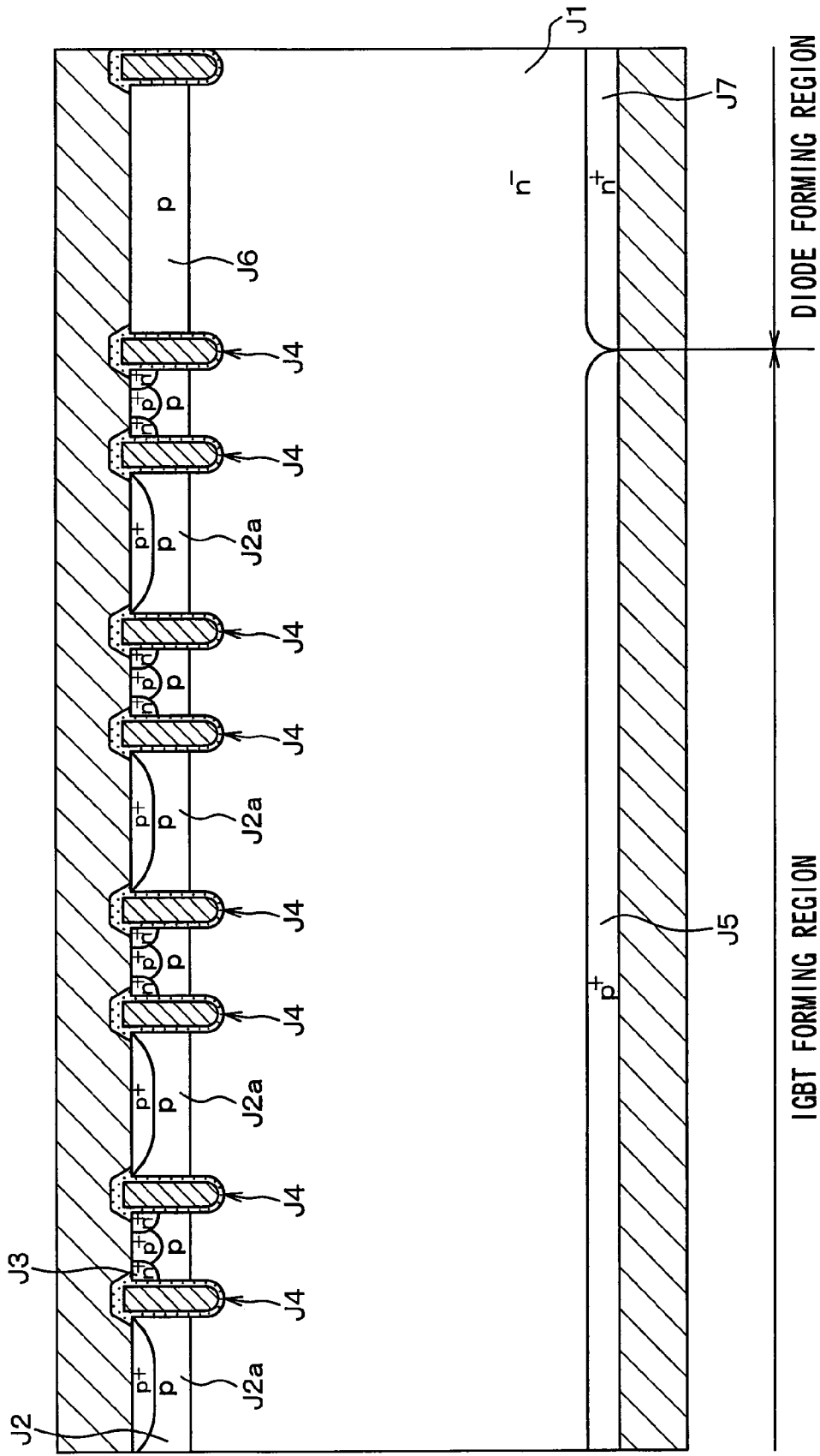
FIG. 16 is a cross-sectional view of a semiconductor device according to a related art.

FIG. 16 is a cross-sectional view of a semiconductor device according to a comparative example. In the semiconductor device, an IGBT structure and a diode structure are disposed in the same semiconductor substrate.

As shown in FIG. 16, in the semiconductor device according to the comparative example, a p-type region J2, an $n^+$-type impurity region J3, which operates as an emitter region, and a trench gate structure J4 are formed in a surface portion of the n-type drift layer J1, and a $p^+$-type impurity region J5, which operates as a collector region, is formed on a rear surface side of the n-type drift layer J1 to form an IGBT.

The semiconductor device has a thinning structure including a region which operates as an IGBT and a region which does not operate as an IGBT, so as to restrict flow of excessive current at a short circuit by restricting a current capacity of the IGBT. Specifically, the $n^+$type impurity region 3 is not provided on all side surfaces of multiple trench gate structures J4. In sections defined between the multiple trench gate structures J4, a section with the $n^+$-type impurity region J3 and a section without the $n^+$-type impurity region J3 are repeatedly arranged by a predetermined number of sections. Because the semiconductor device has the thinning structure in which the region operating as the IGBT is thinned out, a diode structure in which the p-type region J2 in the thinned-out section operates as an anode p-type region J2a is provided. Accordingly the semiconductor device has the diode structure in the IGBT forming region. In the IGBT forming region, the section operating as the IGBT is referred to as an IGBT operating section, and the section having the diode structure and not operating as the IGBT is referred to as the thinned-out section. Furthermore, an element structure of an IGBT including a thinned-out section is referred to as the thinning structure.

In the diode formed in the thinned-out section in the IGBT forming region, when the IGBT is applied with a gate voltage and a channel is formed, a short circuit between the $n^+$-type impurity region J3 and the n-type drift layer J1 is caused. Thus, a PN junction is less likely to be applied with a voltage, and the diode is less likely to operate.

For the above-described reason, an anode p-type region J6 is formed adjacent to the IGBT forming region, and an $n^+$-type impurity region J7, which operates as a cathode region, is formed on the rear surface side of the n-type drift layer J1. The anode p-type region J6, the n-type drift layer J1, and the $n^+$-type impurity region J7 form a FWD. By forming a specialized diode forming region separately from the IGBT forming region as described above, the semiconductor device can perform a diode operation with certainty using the diode formed in the diode forming region.

In the semiconductor device according to the comparative example, an impurity concentration of the anode p-type region J6 in the diode forming region may be reduced so that the amount of hole implantation from the diode forming region can be reduced to improve a recovery property. However, in the thinning structure, impurity concentrations of the p-type region J2 and the anode p-type region J2a are high in the whole region of the IGBT forming region including the IGBT operating section and the thinned-out section. Thus, holes are implanted through the anode p-type region J2a in the thinned-out section, and the holes move to the diode forming region. Therefore, even when the impurity concentration of the anode p-type region J6 in the diode forming region is reduced, it is difficult to reduce the hole implantation amount sufficiently.

Embodiments of the present disclosure will be described with reference to drawings. In each of the following embodiments, the same reference number is given to the same or equivalent parts in the drawings.

(First Embodiment)

Figure 1:
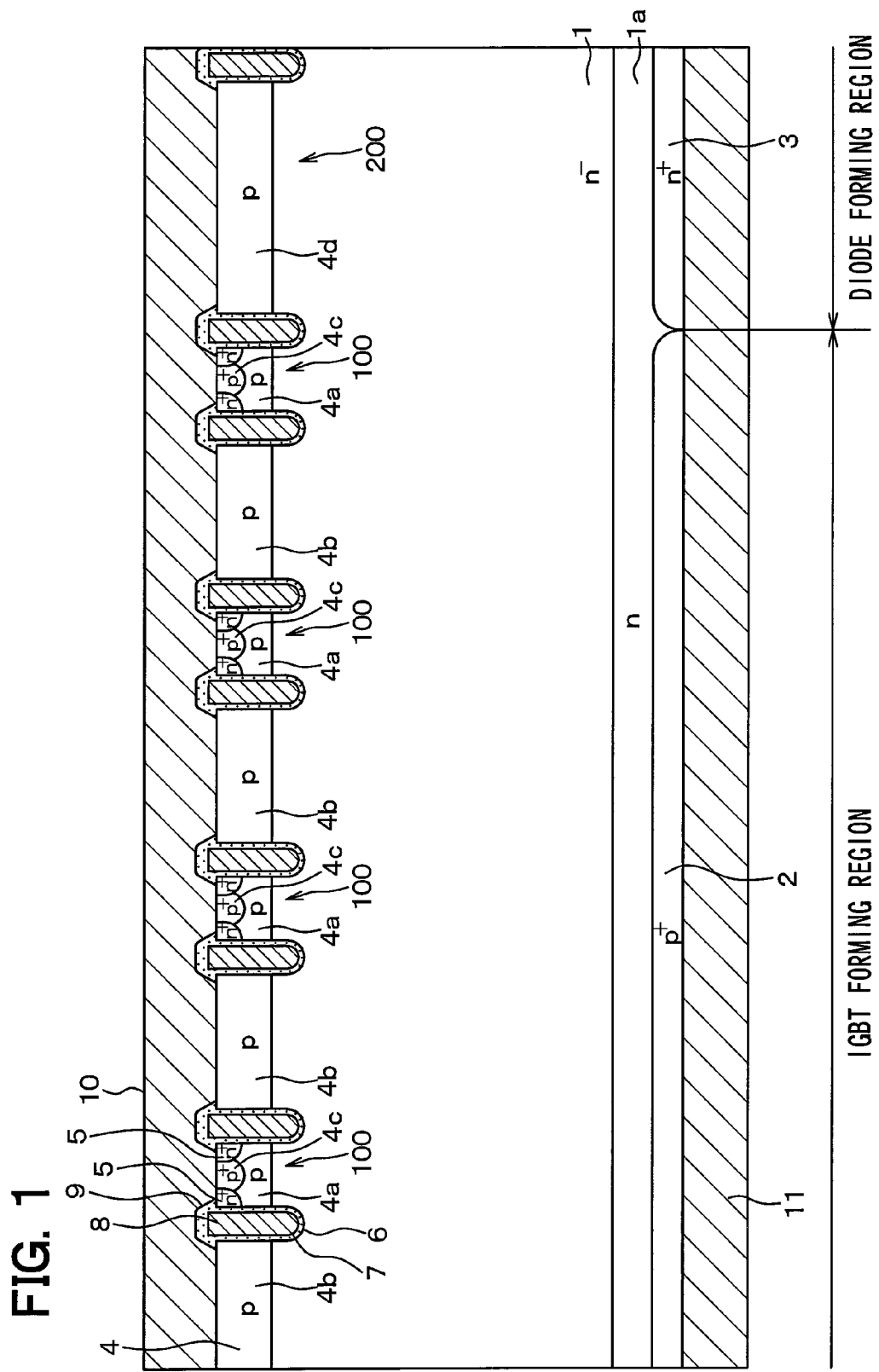
FIG. 1 is a cross-sectional view of a semiconductor device according to a first embodiment of the present disclosure.

A semiconductor device according to a first embodiment of the present disclosure will be described with reference to FIG. 1 and FIG. 2. FIG. 1 is a cross-sectional view of the semiconductor device taken along line I-I in FIG. 2. The semiconductor device according to the present embodiment includes an element having a breakdown voltage of 1500 V as an example.

As shown in FIG. 1, the semiconductor device includes a semiconductor substrate that includes an $n^-$-type drift layer 1. The $n^-$-type drift layer 1 has a thickness of, for example 125 μm and has an n-type impurity concentration of $7.1 \times 10^{13}$ $cm^{-3}$. In the semiconductor substrate, IGBTs 100 and FWDs 200 are formed. As shown in FIG. 1 and FIG. 2, the semiconductor device includes a cell region and a peripheral region surrounding the cell region. The cell region includes IGBT forming regions in which the IGBTs 100 are formed and diode forming regions in which the FWDs 200 are formed. As shown in FIG. 2, the cell region including the IGBT forming region and the diode forming region is located at a center portion of a chip that configures the semiconductor device. The diode forming regions extend along the IGBT forming regions. The diode forming regions and the IGBT forming regions are alternately arranged. The peripheral region surrounds a periphery of the cell region. For example, the chip configuring the semiconductor device is 12.8 mm square. The $n^-$-type drift layer 1 has a front surface and a rear surface. The front surface corresponds to a first surface and the rear surface corresponds to a second surface.

In the IGBT forming region and the diode forming region, a field stop (FS) layer 1a made of an n-type layer is disposed in a rear surface portion of the $n^-$-type drift layer 1. For example, the FS layer 1a has a diffusion depth of 1.5 μm and has an n-type impurity concentration of $2 \times 10^{16}$ $cm^{-3}$. In a rear surface portion of the FS layer 1a, a $p^+$-type impurity region 2, which operates as a collector region, and an $n^+$-type impurity region 3, which operates as a cathode region, are disposed.

The $p^+$-type impurity region 2 is formed by implanting p-type impurities such as boron. The $p^+$-type impurity region 2 has a diffusion depth of 0.5 μm and has a p-type impurity concentration of $5 \times 10^{17}$ $cm^{-3}$ to $1 \times 10^{19}$ $cm^{-3}$ (e.g., $1 \times 10^{18}$ $cm^{-3}$). The $n^+$-type impurity region 3 is formed by implanting n-type impurities such as phosphorus. The $n^+$-type impurity region 3 has a diffusion depth of 0.5 μm and has an n-type impurity concentration of $5 \times 10^{19}$ $cm^{-3}$ to $4 \times 10^{20}$ $cm^{-3}$ (e.g., $1 \times 10^{20}$ $cm^{-3}$). On the rear surface side of the $n^-$-type drift layer 1, mainly the $p^+$-type impurity region 2 is disposed, and partially the $n^+$-type impurity region 3 is formed. Regions in which the $p^+$-type impurity region 2 is formed are the IGBT forming region, and regions in which the $n^+$-type impurity region 3 is formed are diode forming regions. In the present embodiment, each of the IGBT forming regions has a width of 300 μm, and each of the diode forming regions has a width of 100 μm. The IGBT forming regions and the diode forming regions are alternately arranged in a stripe shape as shown in FIG. 2. Although the IGBT forming regions and the diode forming regions are schematically illustrated in FIG. 2, actually, a greater number of the IGBT forming regions and the diode forming regions are alternately arranged.

In the IGBT forming region, a p-type region 4 is disposed in a front surface portion of the n$^-$-type drift layer 1. For example, the p-type region 4 has a thickness of 1.5 μm. A plurality of trenches 6 penetrates the p-type region 4 to the n$^-$-type drift layer 1. In other words, the trenches 6 extend to a depth deeper than the p-type region 4. The trenches 6 divide the p-type region 4 into a plurality of regions. The trenches 6 are provided at predetermined intervals. The trenches 6 may have a stripe structure in which the trenches 6 extend in parallel with each other. The trenches 6 may also have a ring structure in which the trenches 6 extend in parallel with each other and end portions of each trench 6 are rounded and are connected with end portions of an adjacent trench 6. In cases where the trenches 6 have the ring structure, the trenches 6 may have a multiple-ring structure that includes a plurality of groups each including a plurality of trenches 6.

In the IGBT forming region, the trenches 6 divide the p-type region 4 into a plurality of regions including channel p-type regions 4a and anode p type regions 4b. At a front surface portion of each channel p-type region 4a, n$^+$-type impurity regions 5, which operate as emitter regions, are disposed. The n$^+$-type impurity regions 5 are disposed along sidewalls of the trenches 6. The channel p-type regions 4a, in which the n$^+$-type impurity regions 5 are formed, correspond to IGBT operating sections that operate as IGBTs. The other regions in the p-type region 4 without the n$^+$-type impurity region 5 are the anode p-type regions 4b. Sections including the anode p-type regions 4b correspond to thinned-out sections and operate as diodes not IGBTs.

The channel p-type regions 4a have an impurity area density different from the anode p-type regions 4b. An impurity area density is a value calculated by integrating an impurity concentration profile in a depth direction and is expressed by the number of impurities/cm$^{-2}$. A p-type impurity area density of the channel p-type regions 4a is higher than a p-type impurity area density of the anode p-type regions 4b. For example, the channel p-type regions 4a have an area density of $2.0 \times 10^{13}$ cm$^{-2}$ to $1.0 \times 10^{14}$ cm$^{-2}$, and the anode p-type regions 4b have an area density of $5.0 \times 10^{12}$ cm$^{-2}$ to $3 \times 10^{13}$ cm$^{-2}$. The channel p-type regions 4a and the anode p-type regions 4b have substantially the same thickness. For example, the channel p-type regions 4a and the anode p-type regions 4b have a thickness of 2 μm to 4 μm.

At the front surface portion of the channel p-type region 4a, a body p-type region 4c having a high impurity concentration is disposed between the n$^+$-type impurity regions 5, which are disposed at both sides of the channel p-type region 4a. Thus, in the IGBT operating section, a surface concentration of p-type impurity of the p-type region 4 is high. For example, the body p-type region 4c has a thickness of 1.5 μm, and has a surface concentration of p-type impurity of $4 \times 10^{19}$ cm$^{-3}$.

An impurity concentration of the n$^+$-type impurity regions 5 is higher than the impurity concentration of the n$^-$-type drift layer 1. The n$^+$-type impurity regions 5 terminate in the p-type region 4 and are in contact with the side surfaces of the trenches 6. The n$^+$-type impurity regions 5 have rod shapes extending in a longitudinal direction of the trenches 6 and terminate inside ends of the trenches 6.

The trenches 6 have a depth of 3.0 μm to 6.0 μm. As described above, the trenches 6 are arranged at the predetermined intervals. In the IGBT operating sections, a distance between adjacent trenches 6 is less than or equal to 35 μm. In the thinned-out sections operating as the diodes, a distance between adjacent trenches 6 is greater than or equal to 5 μm. Each of the distances corresponds to the width of the IGBT operating sections and the width of the thinned-out sections. The distance between adjacent trenches 6 means a distance between a center of one trench 6 and a center of adjacent trench 6.

Each of the trenches 6 is filled with a gate insulating layer 7 formed to cover an inner wall of each of the trenches 6 and a gate electrode 8 formed on a surface of the gate insulating layer 7 and made of doped polysilicon. In other words, the gate insulating layer 7 is disposed on surfaces of the trenches 6 and the gate electrode 8 is disposed on a surface of the gate insulating layer 7. The gate electrode 8 in one trench 6 is electrically coupled with the gate electrodes 8 in the other trenches 6 so that the gate electrodes 8 are applied with the same gate voltage.

The n$^+$-type impurity regions 5 and the channel p-type regions 4a are electrically coupled with an upper electrode 10, which operates as an emitter electrode, through contact holes 9a defined by an interlayer insulating layer 9. The upper electrode 10 and wirings are covered by a protective layer (not shown). On the rear surface side of the p$^+$-type impurity region 2, a lower electrode 11 is formed. Accordingly, the IGBTs 100 are formed.

Also in the diode forming region, the p-type region 4 having a predetermined depth is disposed in the front surface portion of the n$^-$-type drift layer 1 in a manner similar to the IGBT forming region. The p-type region 4 in the diode forming region operates as anode p-type regions 4d. The anode p-type regions 4d in the diode forming region may have a p-type impurity area density independent from the area density of the p-type region 4 in the IGBT forming region. The area density of the anode p-type regions 4d in the diode forming region is lower than the area density of the channel p-type regions 4a. In the present embodiment, the area density of the anode p-type regions 4d in the diode forming region is similar to the area density of the anode p-type regions 4b in the IGBT forming region.

In the diode forming region, the FWDs 200 having the diode structure are formed. In the FWDs 200, PN junctions are formed by the anode p-type regions 4d, which operate as an anode, and the n$^-$-type drift layer 1 and the n$^+$-type impurity region 3, which operates as a cathode. In the FWDs 200, the anode p-type regions 4d are electrically coupled with the upper electrode 10 as an anode electrode, and the n$^+$-type impurity region 3 is electrically coupled with the lower electrode 11 as a cathode electrode.

Thus, in the IGBTs 100 and the FWDs 200, the emitter and the anode are electrically coupled with each other and the collector and the cathode are electrically coupled each other such that IGBTs 100 and the FWDs 200 are coupled in parallel with each other in the same chip.

A cross-sectional view of the peripheral region is not shown. In the front surface portion of the n$^-$-type drift layer 1, a p-type diffusion layer deeper than the p-type region 4 is disposed to surround the periphery of the cell region. Furthermore, a p-type guard ring layer having a multiple-ring structure is disposed to surround a periphery of the p-type diffusion layer. Accordingly, the peripheral region has a high breakdown voltage structure. Because the high breakdown voltage structure can expand an electric field in an unbiased manner, the semiconductor device can have a high breakdown voltage.

The semiconductor device having the IGBT structure and the diode structure according to the present embodiment has the above-described structure.

As described above, in the semiconductor device according to the present embodiment, the p-type impurity area density of the anode p-type region 4d in the diode forming region is lower than the p-type impurity area density of the channel p-type region 4a in the IGBT forming region. Thus, the amount of hole implantation from the diode forming region can be reduced, and a recovery property can be improved.

Furthermore, in the IGBT forming region, the p-type impurity area density of the anode p-type regions 4b in the thinned-out sections is lower than the p-type impurity area density of the channel p-type regions 4a in the IGBT operating sections. Thus, the p-type impurity area density of the p-type regions 4 is not increased in the whole area of the IGBT forming region including the IGBT operating sections and the thinned-out sections in a manner similar to the comparative example, but the p-type impurity area density of the anode p-type region 4b is decreased. Thus, a hole implantation through the anode p-type region 4b can be restricted, and a transfer of the holes to the diode forming region can be reduced. Accordingly, the hole implantation amount can be reduced sufficiently, and a recovery loss can be reduced.

Furthermore, in the semiconductor device according to the present embodiment, the distance between the adjacent trenches 6 in the IGBT operating sections, that is, the width of the IGBT operating sections is less than or equal to 35 μm. Accordingly, a hole concentration can be further reduced, and the recovery property can be further improved. Reasons of the above-described effects will be described with reference to simulation results shown in FIG. 3A to FIG. 3H and FIG. 4A to FIG. 4G.

As shown in FIG. 3A to FIG. 3H, semiconductor devices DIODE0 to DIODE7 having different cross-sectional models are prepared, and hole concentration distributions at times when DIODE0 to DIODE7 perform the IGBT operation and the diode operation are examined. In each cross-sectional model, a width of the IGBT forming region is 150 μm, and a width of the diode forming region is 50 μm, and a repeated pattern of the IGBT forming region and the diode forming region is a half of the repeated pattern shown in FIG. 2. The diffusion depth and the p-type impurity area density of the diode p-type region 4d in the diode forming region is the same in DIODE0 to DIODE7, the diffusion depth is 3.0 μm and the p-type impurity area density is $8.6 \times 10^{12}$ cm$^{-2}$.

In DIODE0 to DIODE7, the trench gate structures are arranged at intervals of 5 μm, and a ratio of thinned-out sections is changed. In DIODE0, all sections in the IGBT forming region are thinned-out sections. In DIODE1, fifteen thinned-out sections are arranged every other at regular intervals, and a width of the IGBT operating sections is 5 μm. In DIODE2, ten thinned-out sections are arranged every third at regular intervals, and a width of the IGBT operating sections is 10 μm. In DIODE3, seven thinned-out sections are arranged every fourth at regular intervals, and a width of the IGBT operating sections is 15 μm. In DIODE4, seven thinned-out sections are arranged every fifth at regular intervals, and a width of the IGBT operating sections is 20 μm. In DIODE5, three thinned-out sections are arranged every eighth at regular intervals, and a width of the IGBT operating sections is 35 μm. In DIODE 6, one thinned-out section is arranged, and a width of the IGBT operating sections is 75 μm. In DIODE7, all sections in the IGBT forming region are IGBT operating sections and the thinned-out section is not provided.

The simulation results in cases where DIODE0 to DIODE7 are applied with direct current of 400 A are shown in FIG. 4A to FIG. 4G. The hole implantation amount is the lowest in DIODE0 in which all the sections in the IGBT forming regions are the thinned-out sections and the IGBT operating section is not provided. In DIODE1 to DIODE6 which include the thinned-out sections, because the p-type impurity area density of the anode p-type regions 4b in the thinned-out sections is lower than the p-type impurity area density of the channel p-type regions 4a, the hole implantation is restricted at the thinned-out sections.

Figure 4A:
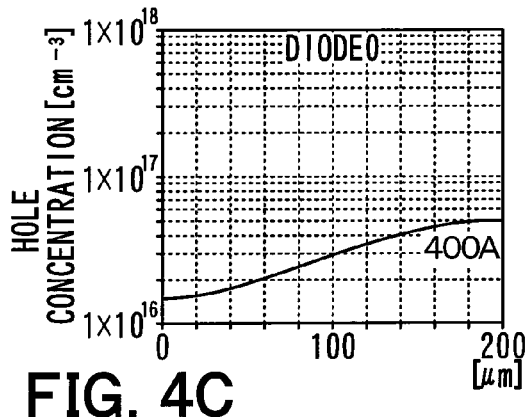
FIG. 4A to FIG. 4G are graphs showing hole concentration distributions in the semiconductor devices used in the simulation.
Figure 4B:
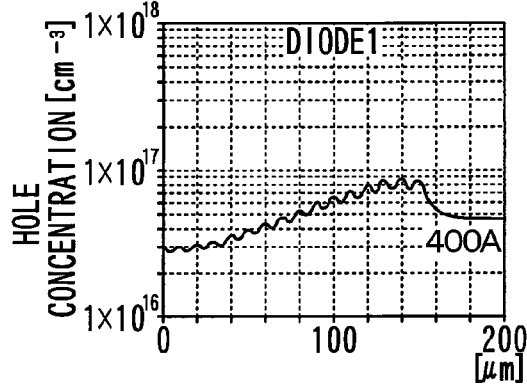
Figure 4C:
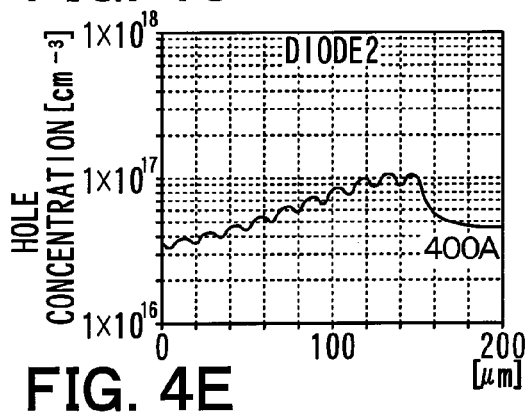
Figure 4D:
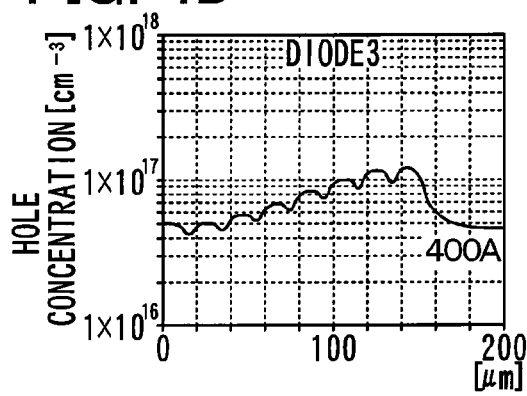
Figure 4E:
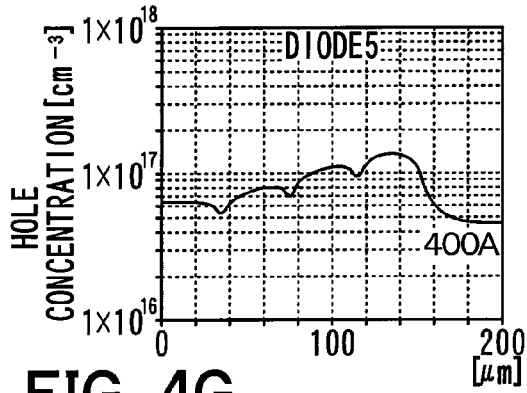
Figure 4F:
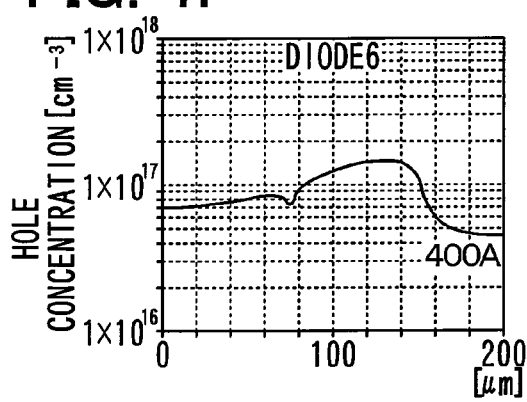
Figure 4G:
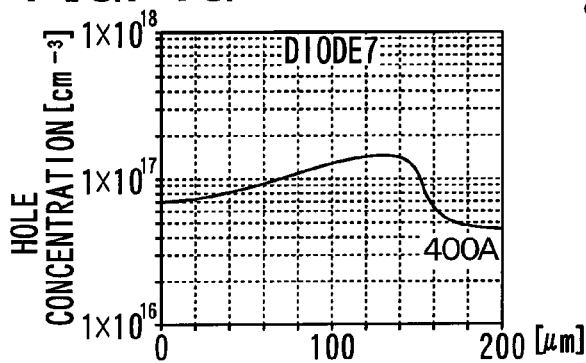

Thus, as shown in FIG. 4B to FIG. 4F, the hole concentration is reduced at the thinned-out sections, and the hole concentration distributions are recessed at positions where the thinned-out sections are arranged. In other words, the hole implantation amount can be reduced in accordance with the amount of the thinned-out sections. In DIODE7, because all the sections in the IGBT forming region are the IGBT operating sections and the thinned-out section is not provided, the hole implantation is not restricted, and the hole concentration is high as shown in FIG. 4G.

Figure 5B:
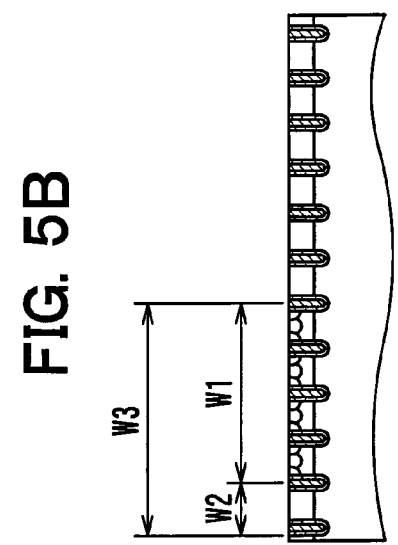
FIG. 5A is a graph showing relationships between a width of an IGBT operating section and a hole concentration with different p-type impurity area density and FIG. 5B is a diagram for explaining a width W1 of the IGBT operating section, a width W2 of a thinned-out section, and a width W3 of a cell.
Figure 5A:
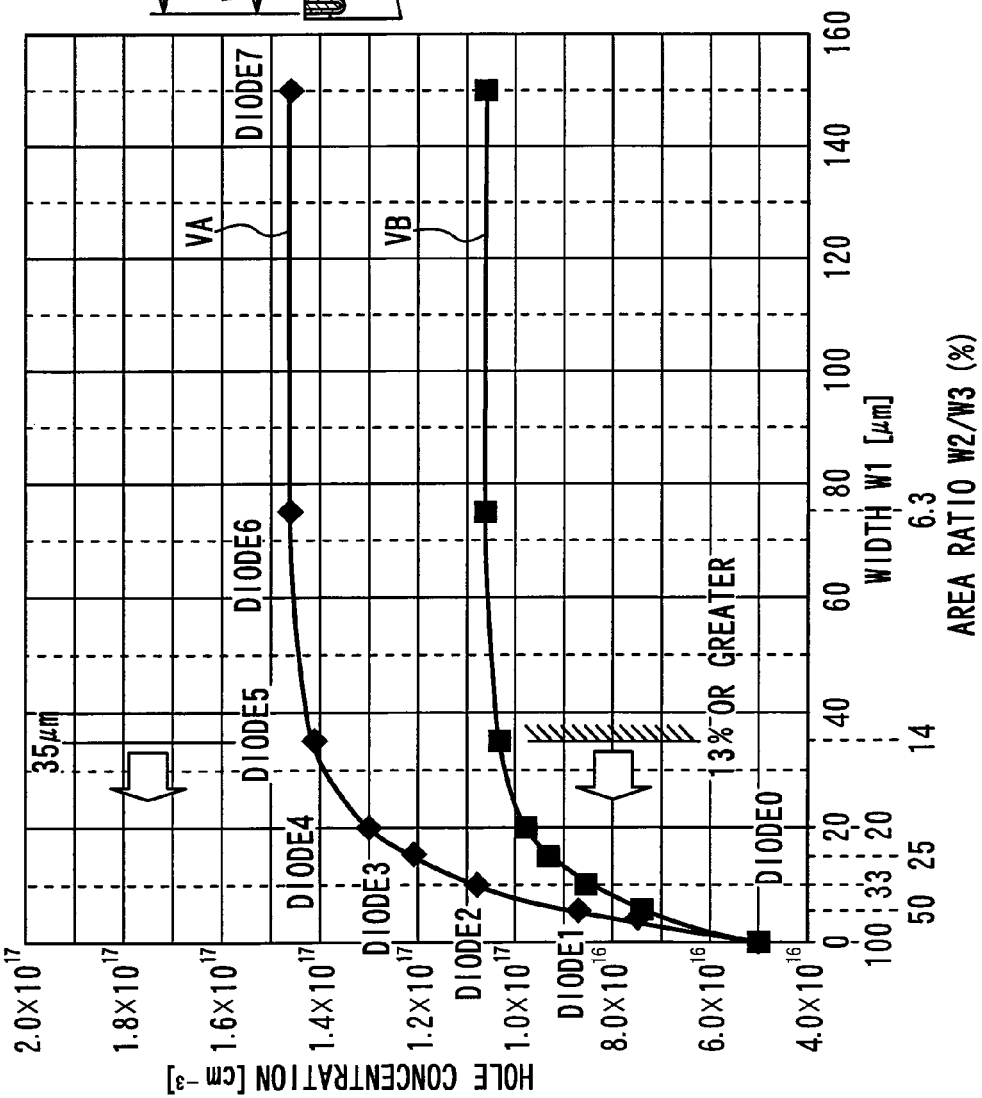

In simulation results shown in FIG. 5A, the width of the IGBT operating section is denoted by W1, the width of the thinned-out sections is denoted by W2, and the width of a cell is denoted by W3. In FIG. 5A, a line VA shows a simulation result in a case where the p-type impurity area density of the channel p-type regions 4a in the IGBT operating sections is $1.0 \times 10^{14}$ cm$^{-2}$, and a line VB shows a simulation result in a case where the p-type impurity area density of the channel p-type regions 4a in the IGBT operating sections is $6.0 \times 10^{14}$ cm$^{-2}$. As shown in FIG. 5A, the hole concentration changes little between DIODE6 and DIODE7. However, the hole concentration starts to decrease from DIODE5. Thus, the hole implantation amount can be more effectively reduced in DIODE1 to DIODE5. Because the hole implantation amount is more effectively reduced from the structure of the DIODE5 in which the width of the IGBT operating section is 35 μm, it can be said that the hole implantation amount is more effectively reduced by setting the width of the IGBT operating section to be less than or equal to 35 μm.

Based on the above-described simulation results, in the present embodiment, the width of the IGBT operating section is set to be less than or equal to 35 μm. Thus, the hole implantation amount can be more effectively reduced, and the recovery property can be more improved.

In the present embodiment, the width of the IGBT operating section is set to be less than or equal to 35 μm. However, this is a dimension in a case simulated under the condition that the width of the IGBT forming region is 150 μm, the width of the diode forming region is 50 μm, and the repeated pattern of the IGBT forming region and the diode forming region is a half of the repeated pattern shown in FIG. 2. When a condition of the width of the IGBT operating sections is generalized so as to be applied to cases where the width of the IGBT forming region and the width of the diode forming region are changed, the condition can be expressed by a ratio of an area of the anode p-type region 4b to an area of the IGBT forming region. In order to set the width of the IGBT operating sections to be less than or equal to 35 μm, the ratio of the area of the anode p-type region 4b to the area of the IGBT forming region have to be greater than or equal to 13%. Thus, when the ratio of the area of the anode p-type region 4b to the area of the IGBT forming region is greater than or equal to 13%, the hole implantation amount can be more reduced, and the recovery property can be more improved.

In the cross-sectional models shown in FIG. 3A to FIG. 3H, the width of the thinned-out sections is set to be 5 μm. It is needless to say that the width of the thinned-out sections may be greater than or equal to 5 μm. Basically, the width of the thinned-out sections depends on an area of the IGBT operating sections in the cell regions, that is, an area corresponding to a current capacity required to the IGBTs 100. The hole concentration can be reduced with increase in the width of the thinned-out sections. By setting the width of the thinned-out section to be greater than or equal to 5 μm, the hole implantation amount can be more reduced, and the recovery property can be more improved.

Figure 6:
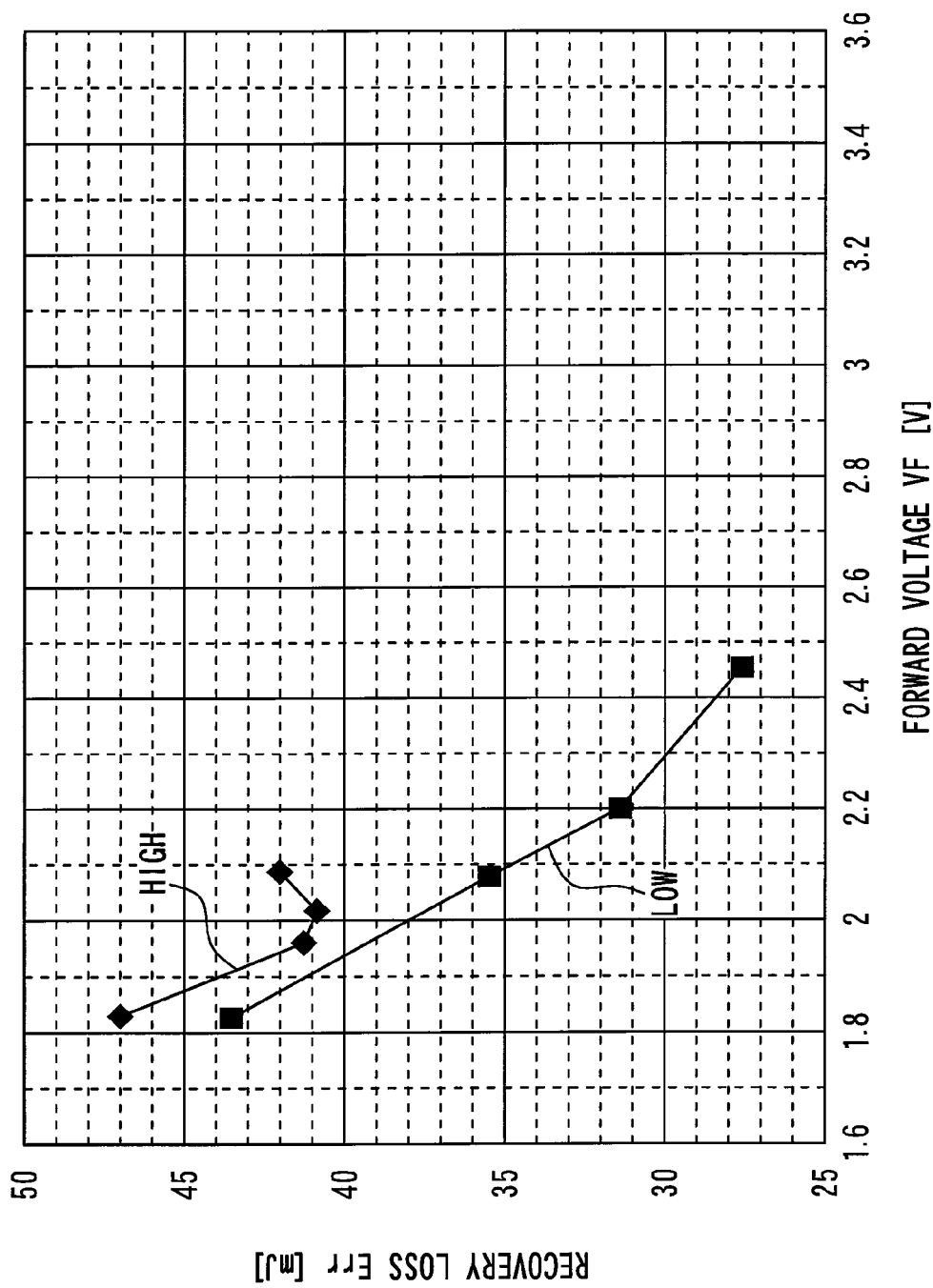
FIG. 6 is a graph showing relationships between a forward voltage and a recovery loss in a case where a p-type impurity area density is high and in a case where a p-type impurity area density is low.

FIG. 6 is a graph showing relationships between a forward voltage VF and a recovery loss Err in a case where a p-type impurity area density in the anode p-type region 4b is high and in a case where a p-type impurity area density in the anode p-type region 4b is low. In the present cases, the IGBT operating sections have a width of 5 μm and the thinned-out sections have a width of 15 μm. In the graph shown in FIG. 6, the forward voltage at a time when the whole of the thinned-out sections in the IGBT forming regions and the diode structures in the diode forming regions operate as diodes is shown as the forward voltage VF.

As shown in FIG. 6, in the case where the p-type impurity area density of the anode p-type region 4b in the thinned-out sections is high, VF-Err concentrates at a narrow range. However, in the case where the p-type impurity area density of the anode p-type region 4b in the thinned-out section is low, VF-Err distributes over a wide area. Because characteristics of VF-Err depend on a required design specification when the semiconductor device including the IGBT structure and the diode structure is designed, it is preferred that the characteristics of VF-Err distributes over a wide area. Thus, when the p-type impurity area density in the anode p-type region 4b in the thinned-out section is low, the characteristics of the VF-Err can distribute over a wide range, and a freedom of design can be improved.

The semiconductor device according to the present embodiment can be manufactured by a method similar to a manufacturing method of a semiconductor device having a conventional structure. However, it is necessary to set the p-type impurity area density of the channel p-type regions 4a to be higher than the p-type impurity area density of the anode p-type regions 4b, 4d. For example, the channel p-type region 4a and the anode p-type regions 4b, 4d may be formed with different masks and ion implantations may be performed so that the p-type impurity area density of the channel p-type regions 4a is higher than the p-type impurity area densities of the anode p-type regions 4b, 4d.

In another example, the channel p-type region 4a and the anode p-type regions 4b, 4d may be formed at the same time, and the p-type impurities may be further implanted to the channel p-type region 4a using a mask for forming the body p-type region 4c in the IGBT forming region so that the p-type impurity area density of the channel p-type region 4a is higher than the p-type impurity area densities of the anode p-type regions 4b, 4d. In the present example, a mask that covers the anode p-type regions 4b, 4d is used so that p-type impurities for forming the body p-type region 4c are not implanted to the anode p-type regions 4b, 4d.

The impurity concentration of the anode p-type region 4b in the IGBT forming region may be different from the impurity concentration of the anode p-type region 4d in the diode forming region. However, when the anode p-type regions 4b, 4d have the same impurity concentration, it is not necessary to use different masks, and a manufacturing process can be simplified.

Figure 7:
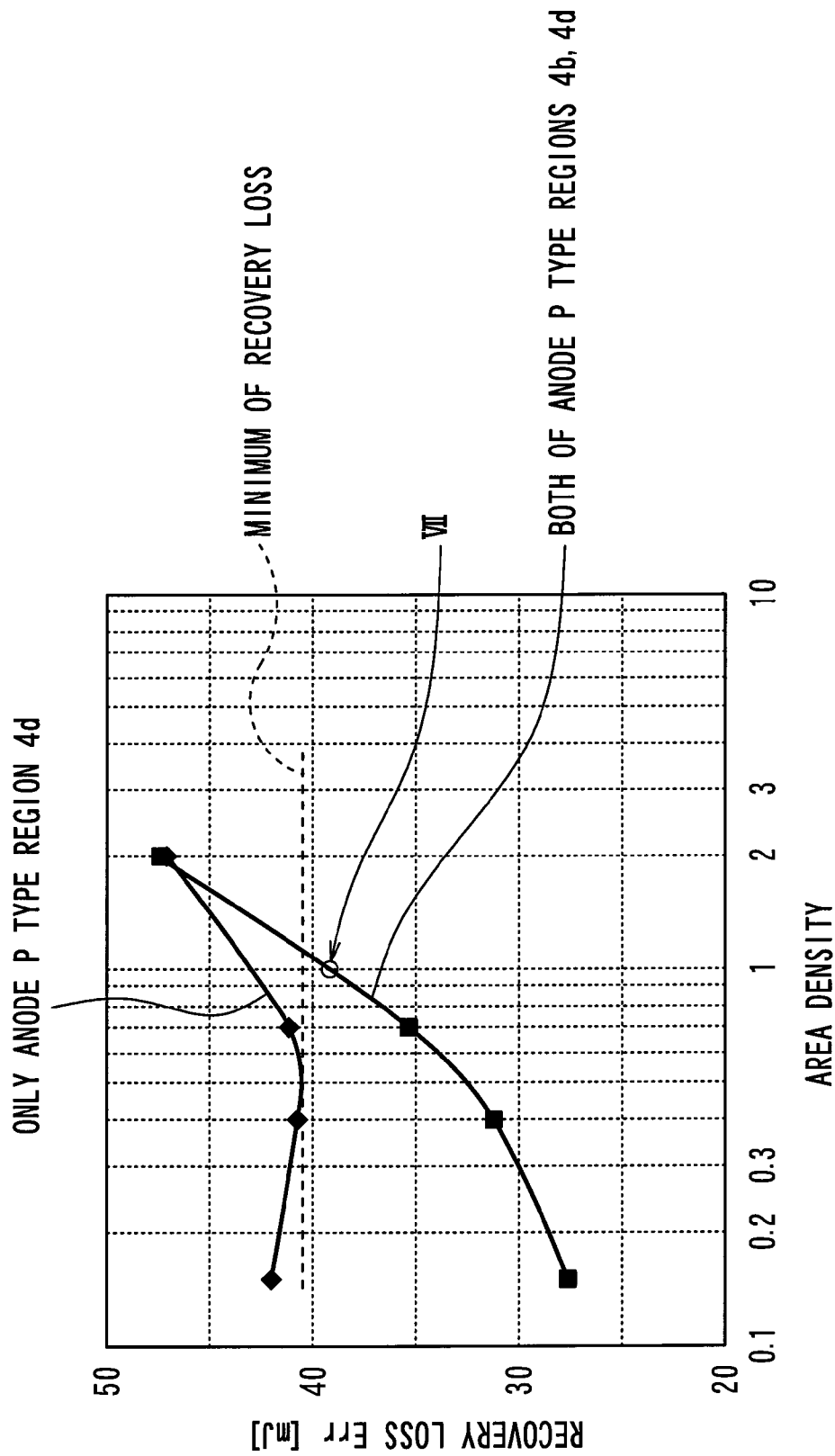
FIG. 7 is a graph showing relationships between a forward voltage and a recovery loss in a case where only an area density of an anode p-type region in a diode forming region is decreased and in a case where area densities of both of the anode p-type region in the diode forming region and an anode p-type region in the IGBT forming region are decreased.
Figure 8:
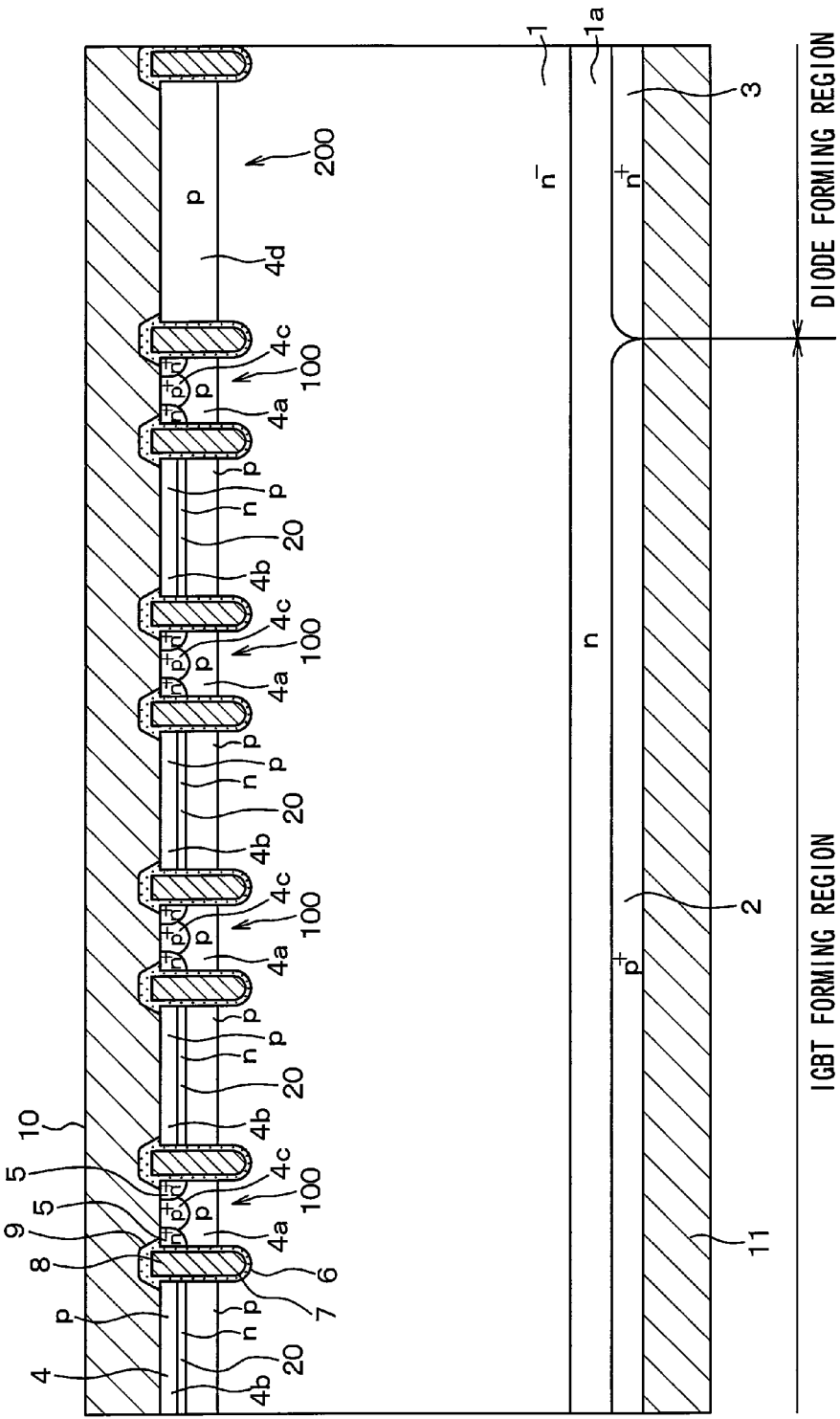
FIG. 8 is a cross-sectional view of a semiconductor device according to a second embodiment of the present disclosure.

As described above, in the semiconductor device according to the present embodiment, the p-type impurity area density of the channel p-type region 4a is higher than the p-type impurity area densities of the anode p-type regions 4b, 4d. The inventors have studied how much decrease of the area density is effective. Specifically, the p-type impurity area density of the channel p-type region 4a is set to a reference value, the p-type impurity area densities of the anode p-type region 4b in the IGBT forming region and the anode p-type region 4d in the diode forming region are, changed from the reference value, and the recovery loss Err of each case has been examined. In one case, the area densities of the channel p-type region and the anode p-type region 4b are fixed, and only the area density of the anode p-type region 4d in the diode forming region is decreased. In another case, the area densities of both of the anode p-type regions 4b, 4d are decreased. The reference value of the area density of the channel p-type region 4a may be, for example, $3.1 \times 10^{13}$ cm$^{-2}$. FIG. 7 shows a result of the study.

As shown in FIG. 7, in the case where only the area density of the anode p-type regions 4d in the diode forming region is decreased from the reference value, the amount of decrease in the recovery loss Err is not so large. Although the recovery loss Err decreases to a value about 40, which shown by a dashed line, the amount of decrease in the recovery loss from the recovery loss Err (47) in the case where the area density of the anode p-type regions 4d in the diode forming region is the same as the area density (=the reference value) of the channel p-type regions 4a is not so large.

In the case where the area density of the anode p-type regions 4b in the IGBT forming region as well as the anode p-type regions 4d in the diode forming region are lower than the area density of the channel p-type regions 4a as the present embodiment, the recovery loss Err further decreases. In a case where the reference value of the p-type impurity area density in the channel p-type regions 4a is expressed as 2, when the p-type area densities of the anode p-type regions 4b, 4d are less than or equal to 1, which shown by a circle VII, the recovery loss Err is lower than the case where only the p-type impurity area density of the anode p-type regions 4d is decreased.

When the area densities of the anode p-type regions 4b, 4d are less than or equal to 1 in the case where the reference value of the p-type impurity area density of the channel p-type region 4a is expressed as 2, the area densities of the anode p-type regions 4b, 4d are equal to or less than a half of the area density of the channel p-type regions 4a. In such a case, the recovery loss Err can be decreased compared with the case where only the p-type impurity area density of the anode p-type regions 4d is decreased.

Thus, the p-type impurity area density of the anode p-type regions 4b, 4d may be equal to or less than a half of the p-type impurity area density of the anode p-type regions 4b, 4d.

(Second Embodiment)

A semiconductor device according to a second embodiment of the present disclosure will be described. In the present embodiment, a configuration of thinned-out sections is different from the first embodiment, and the other part is similar to the first embodiment. Thus, only a part different from the first embodiment will be described.

The semiconductor device according to the present embodiment includes n-type regions 20. The n-type regions 20 are respectively disposed at middle portions of the anode p-type regions 4b in a depth direction. Each of the n-type regions 20 operates as a hole stopper layer and is coupled with the trenches 6 located on both sides of the corresponding anode p-type region 4b.

Because the n-type regions 20 are disposed, when the IGBT operating sections perform the IGBT operation, carriers are stored in the anode p-type regions 4b under the n-type regions 20. In a case where the n-type regions 20 are not disposed, the holes are extracted toward the upper electrode 10 through the anode p-type regions 4b and the on-voltage increases. In order to reduce the on-voltage, it is preferred that carriers are stored during the IGBT operation as much as possible so as to cause a conductivity modulation. When the n-type regions 20 are disposed, and the carriers are stored in the anode p-type regions 4b under the n-type regions 20, a conductivity modulation can be caused, and the on-voltage can be reduced.

Figure 9:
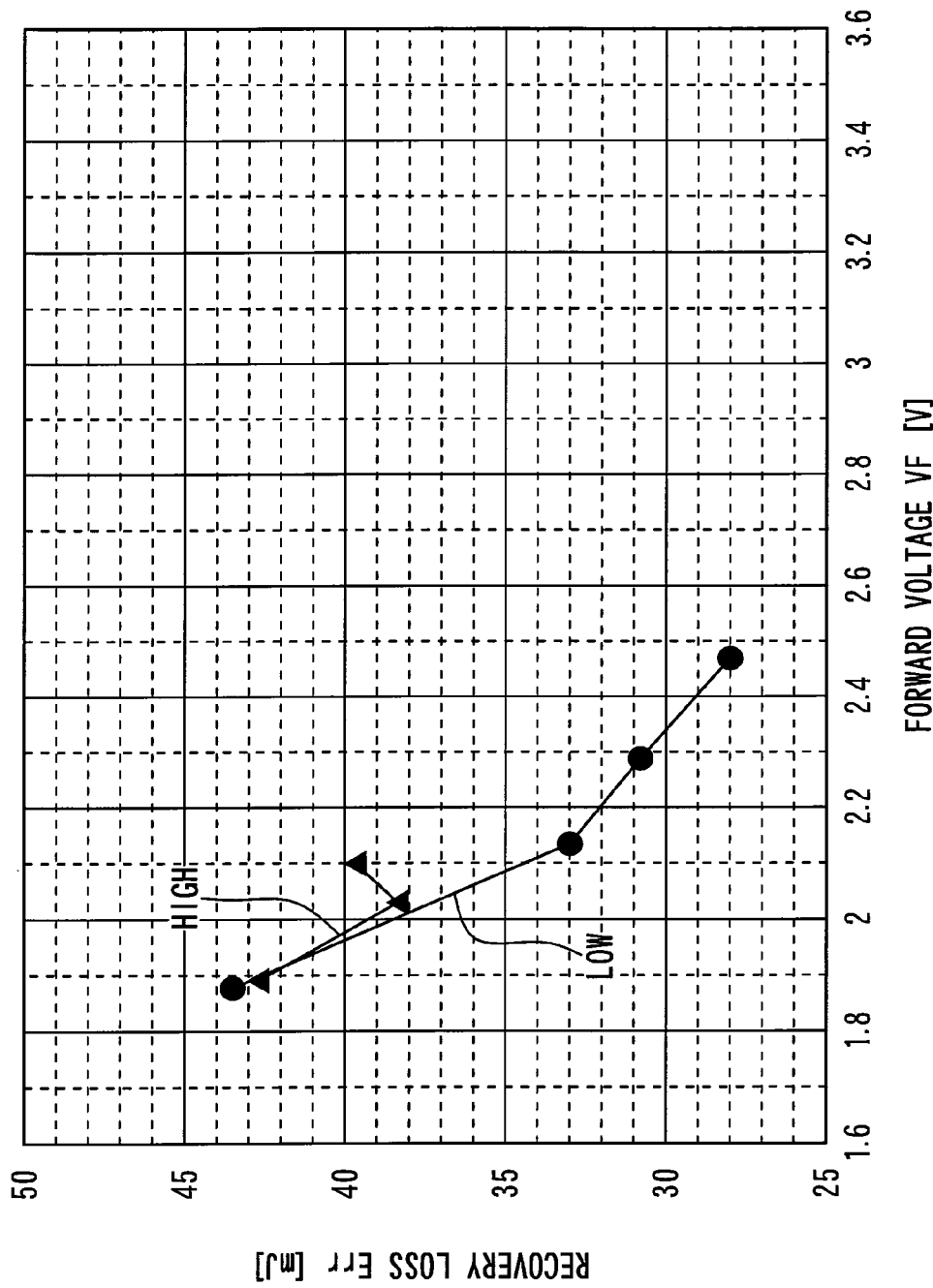
FIG. 9 is a graph showing relationships between a forward voltage and a recovery loss in a case where a surface concentration of a p-type region in a thinned-out section is high and in a case where a surface concentration of a p-type region in a thinned-out section is low.

FIG. 9 is a graph showing relationships between a forward voltage VF and a recovery loss Err in a case where the surface concentration of the p-type region 4 in the thinned-out sections is high and in a case where the surface concentration of the p-type region 4 in the thinned-out sections is low. In the present cases, the IGBT operating sections have a width of 5 μm and the thinned-out sections have a width of 15 μm. Also in the graph shown in FIG. 9, the forward voltage at a time when the whole of the thinned-out sections in the IGBT forming regions and the diode structures in the diode forming regions operate as diodes is shown as the forward voltage VF.

As shown in FIG. 9, even in cases where n-type regions 20 are disposed, when the surface concentration of the p-type region 4 in the thinned-out sections is high, VF-Err concentrates at a narrow range. In contrast, when the surface concentration of the p-type region 4 in the thinned-out sections is low, VF-Err distributes over a wide range. Thus, also in the semiconductor device including the n-type regions 20, characteristics of VF-Err can distribute over a wide range by setting the surface concentration of the p-type region 4 in the thinned-out sections to be low. Accordingly, a freedom of design can be improved.

(Third Embodiment)

A semiconductor device according to a third embodiment of the present disclosure will be described. In the present embodiment, a configuration of a p-type region 4 in a diode forming region is different from the second embodiment, and the other part is similar to the second embodiment. Thus, only a part different from the first embodiment will be described.

Figure 10:
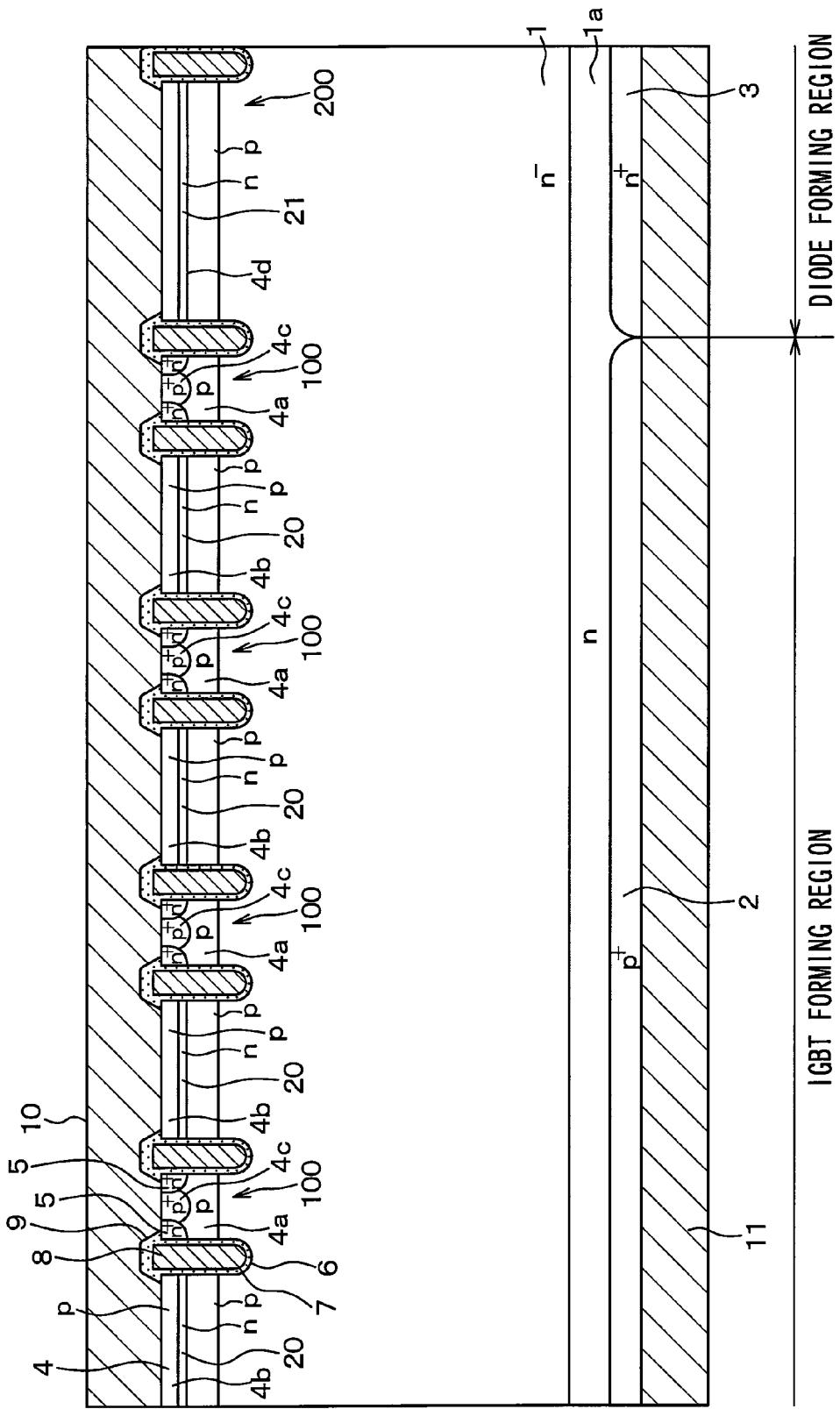
FIG. 10 is a cross-sectional view of a semiconductor device according to a third embodiment of the present disclosure.

As shown in FIG. 10, in the diode forming region, the semiconductor device according to the present embodiment includes an n-type region 21 at a middle portion of an anode p-type region 4d in a depth direction. The n-type region 21 operates as a hole stopper layer and is coupled with trenches 6 located on both sides of the anode p-type region 4d. The n-type region 21 disposed in the diode forming region operates similarly to the n-type regions 20 in the IGBT forming region. Thus, the on-voltage can be further reduced. Because the hole implantation due to the diode operation in the diode forming region can be restricted, the recovery property can be further improved.

(Fourth Embodiment)

A semiconductor device according to a fourth embodiment of the present disclosure will be described. In the present embodiment, a configuration of channel p-type regions 4a in an IGBT forming region is different from the first embodiment, and the other part is similar to the first embodiment. Thus, only a part different from the first embodiment will be described.

Figure 11:
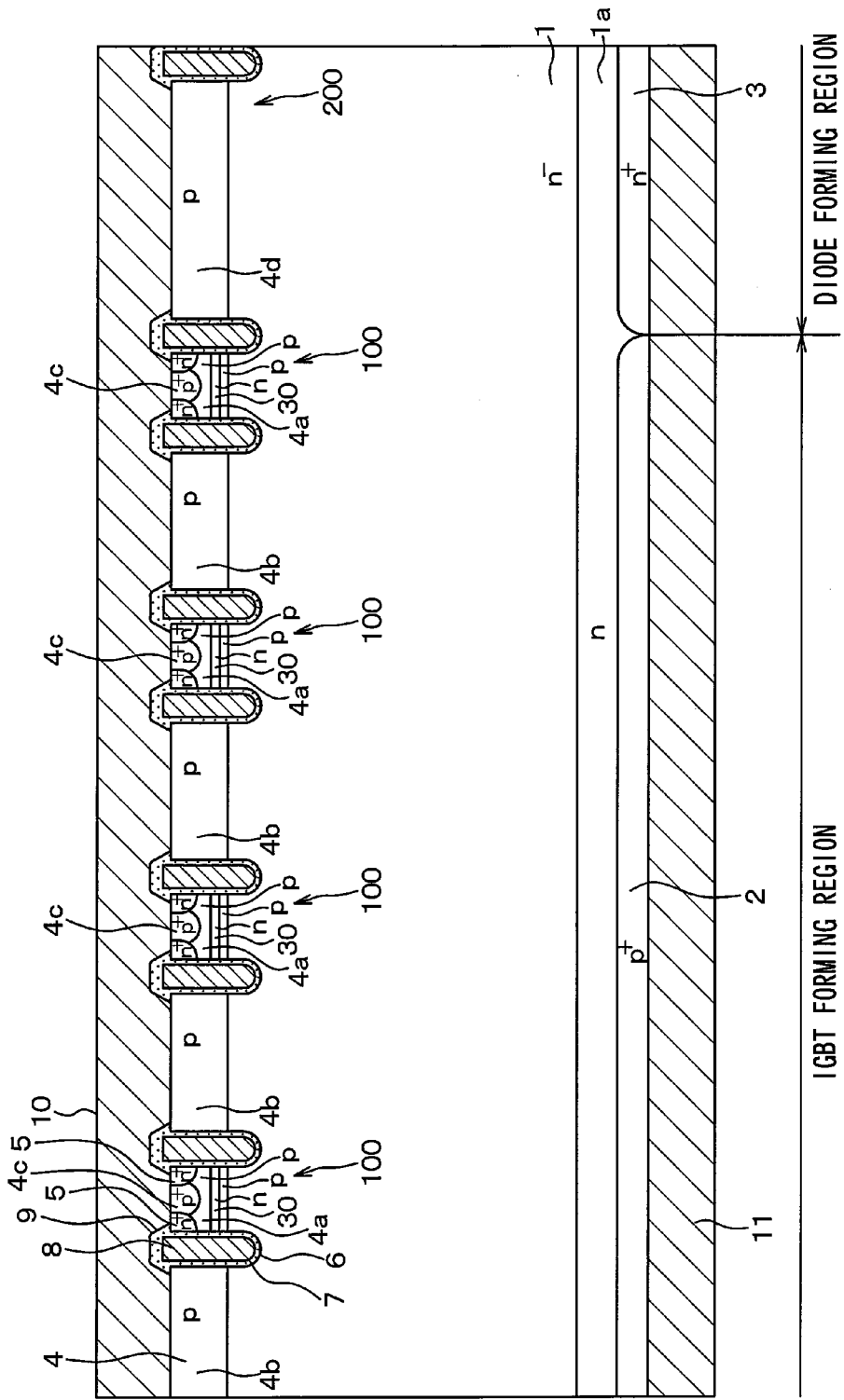
FIG. 11 is a cross-sectional view of a semiconductor device according to a fourth embodiment of the present disclosure.

As shown in FIG. 11, the semiconductor device according to the present embodiment includes n-type regions 30 in the IGBT operating sections in the IGBT forming region. Each of the n-type regions 30 is disposed in a middle portion of the corresponding channel p-type region 4a in a depth direction and is coupled with the trenches 6 located on both sides of the corresponding channel p-type region 4a. When the IGBT operating sections include the n-type regions 30, carriers can be stored in the channel p-type regions 4a under the n-type regions 30 and a conductivity modulation can be caused. Thus, the on-voltage can be further reduced similarly to a case where the n-type regions 20 are disposed in the thinned-out sections.

(Fifth Embodiment)

A semiconductor device according to a fifth embodiment of the present disclosure will be described. In the present embodiment, the positions of the n-type regions 30 are changed from the fourth embodiment, and the other part is similar to the fourth embodiment. Thus, only a part different the fourth embodiment will be described.

Figure 12:
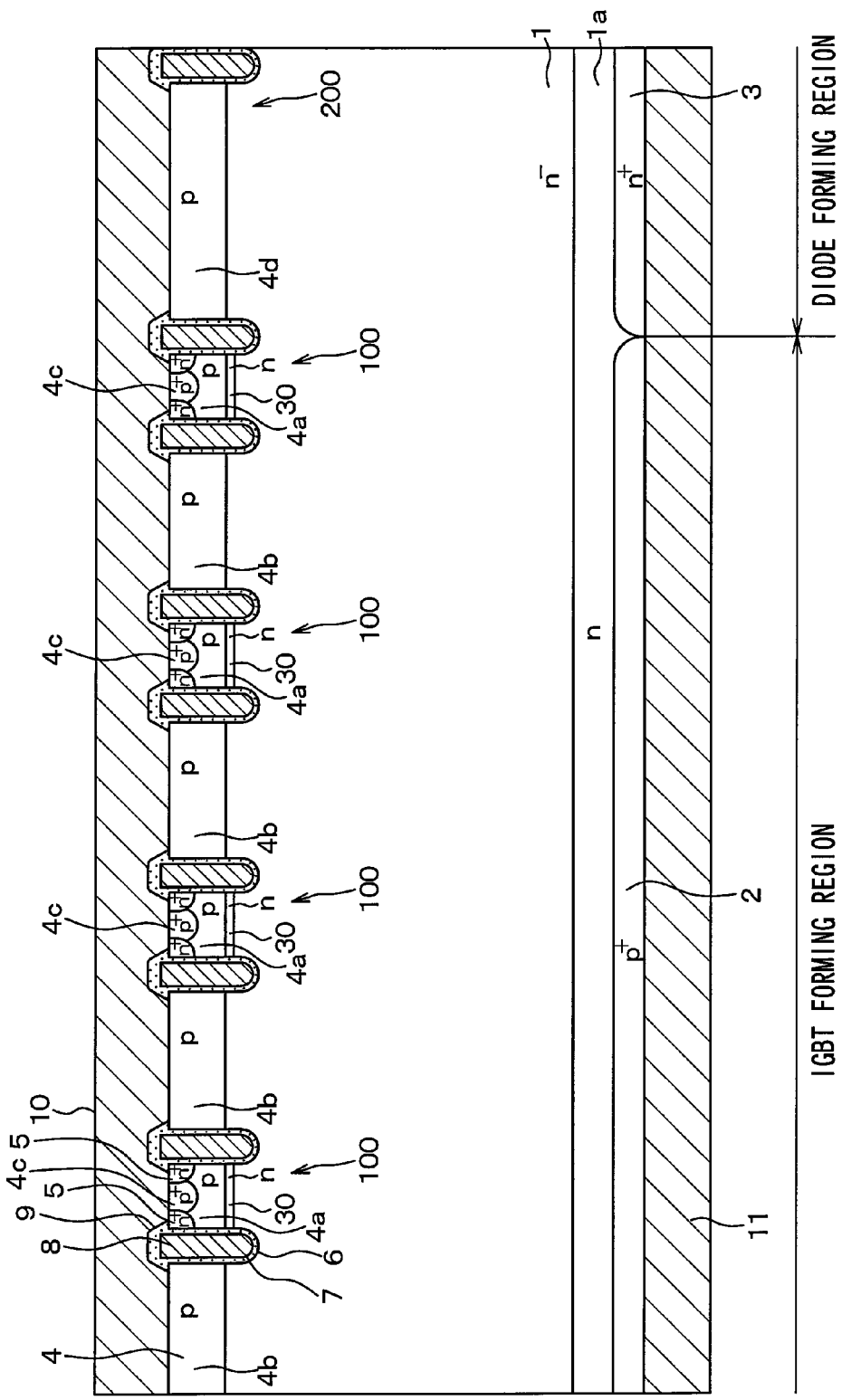
FIG. 12 is a cross-sectional view of a semiconductor device according to a fifth embodiment of the present disclosure.

As shown in FIG. 12, in the present embodiment, each of the n-type regions 30 is disposed at a bottom portion of the corresponding channel p-type region 4a, that is, at a boundary portion between the corresponding channel p-type region 4a and the n$^-$-type drift layer 1 and is coupled with the trenches 6 located on both sides of the corresponding channel p-type region 4a. When the n-type region 30 is disposed at the bottom portion of the channel p-type region 4a, carriers can be stored in the n$^-$-type drift layer 1 under the n-type regions 30, and a conductivity modulation can be caused. Thus, the on-voltage can be further reduced similarly to the fourth embodiment.

(Sixth Embodiment)

A semiconductor device according to a sixth embodiment of the present disclosure will be described. In the present embodiment, widths of anode p-type regions 4b in thinned-out sections in an IGBT forming region are changed from the first embodiment, and the other part is similar to the first embodiment. Thus, only a part different from the first embodiment will be described.

Figure 13:
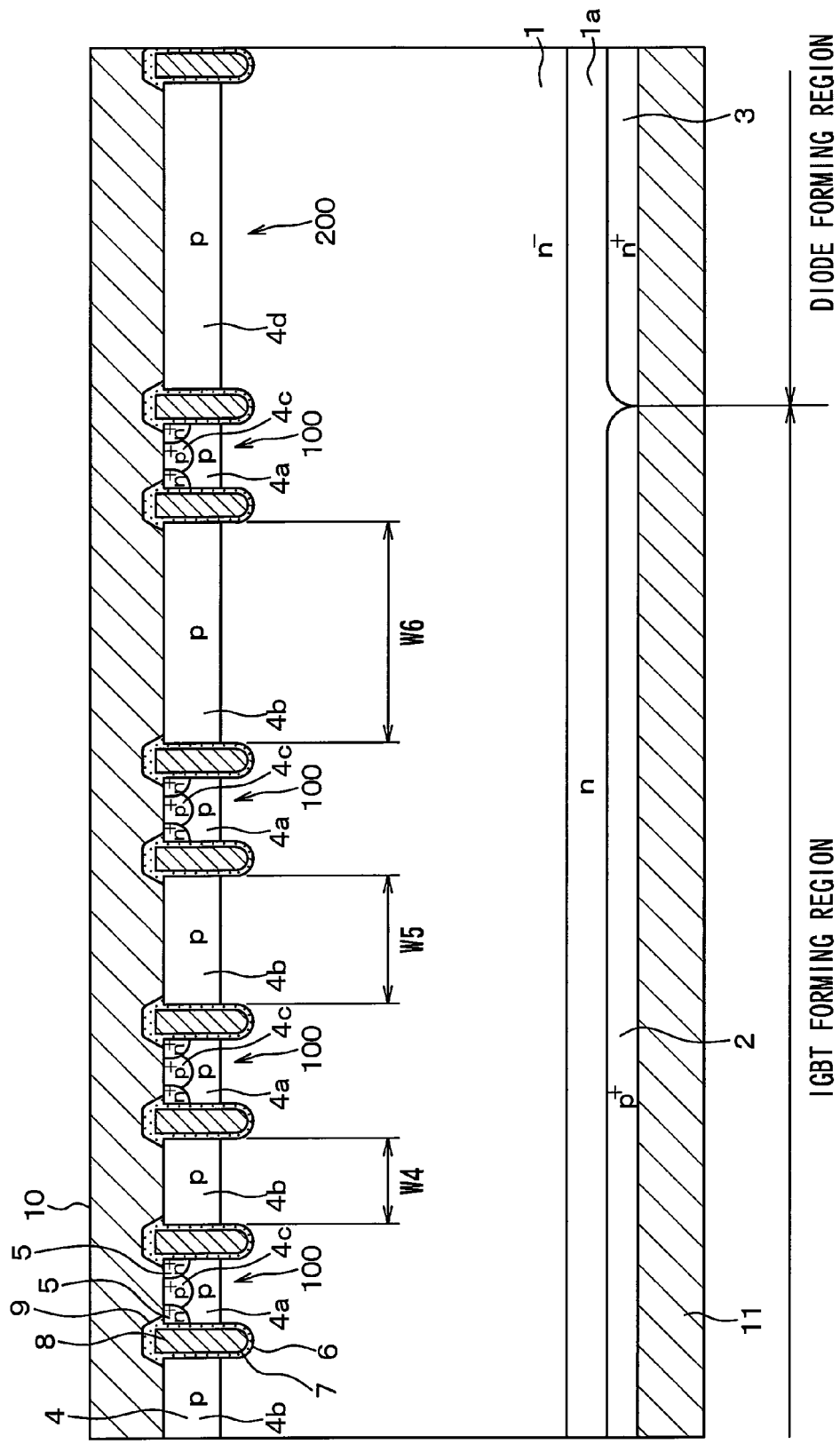
FIG. 13 is a cross-sectional view of a semiconductor device according to a sixth embodiment of the present disclosure.

As shown in FIG. 13, the widths of the anode p-type region 4b in the IGBT forming region increase with decrease in distance from the diode forming region. In other words, the width of the anode p-type region 4b close to the diode forming region is larger than the width of the anode p-type region 4b close to a center portion of the IGBT forming region. In the present case, the widths of the two anode p-type region 4b adjacent to the diode forming region are larger than the width of the anode p-type region 4b located inside the two anode p-type regions 4b.

When the width of the anode p-type region 4b close to the center portion of the IGBT forming region is denoted by W4, and the widths of the anode p-type regions 4b adjacent to the diode forming regions are denoted by W5, W6, respectively, the widths W4-W6 satisfy a relationship of W4<W5, W6. In an example shown in FIG. 13, the widths W4-W6 satisfy a relationship of W4<W5<W6 in such a manner that the widths of the anode p-type region 4b gradually increase with decrease in distance from the diode forming region. For example, when the width W4 is expressed as 1, the width W5 may be 1.5 and the width W6 may be 2.

When the IGBT forming region and the diode forming region are disposed adjacent to each other as the present embodiment, the anode p-type region 4b close to the diode forming region is close to the n$^+$-type impurity region 3. Thus, by increasing the width of the anode p-type region 4b close the diode forming region, a hole implantation at a boundary portion between the IGBT forming region and the diode forming region can be restricted. Thus, when the width of the anode p-type region 4b close to the diode forming region is larger than the width of the anode p-type region 4b located inside thereof, a hole implantation through the anode p-type region 4b can be restricted, and a recovery loss can be further reduced.

In the above-described examples, the widths of two anode p-type regions 4b adjacent to the diode forming region are larger than the width of the anode p-type region 4b located inside thereof. However, at least the width of the anode p-type region 4b closest to the diode forming region have to be larger than the width of the anode p-type region 4b close to the center portion of the IGBT forming region. The width W5 may be equal to the width W6.

(Seventh Embodiment)

A semiconductor device according to a seventh embodiment of the present disclosure will be described. In the present embodiment, the semiconductor device further includes a He-ray irradiation region with respect to the first embodiment, and the other part is similar to the first embodiment. Thus, only a part different the first embodiment will be described.

Figure 14:
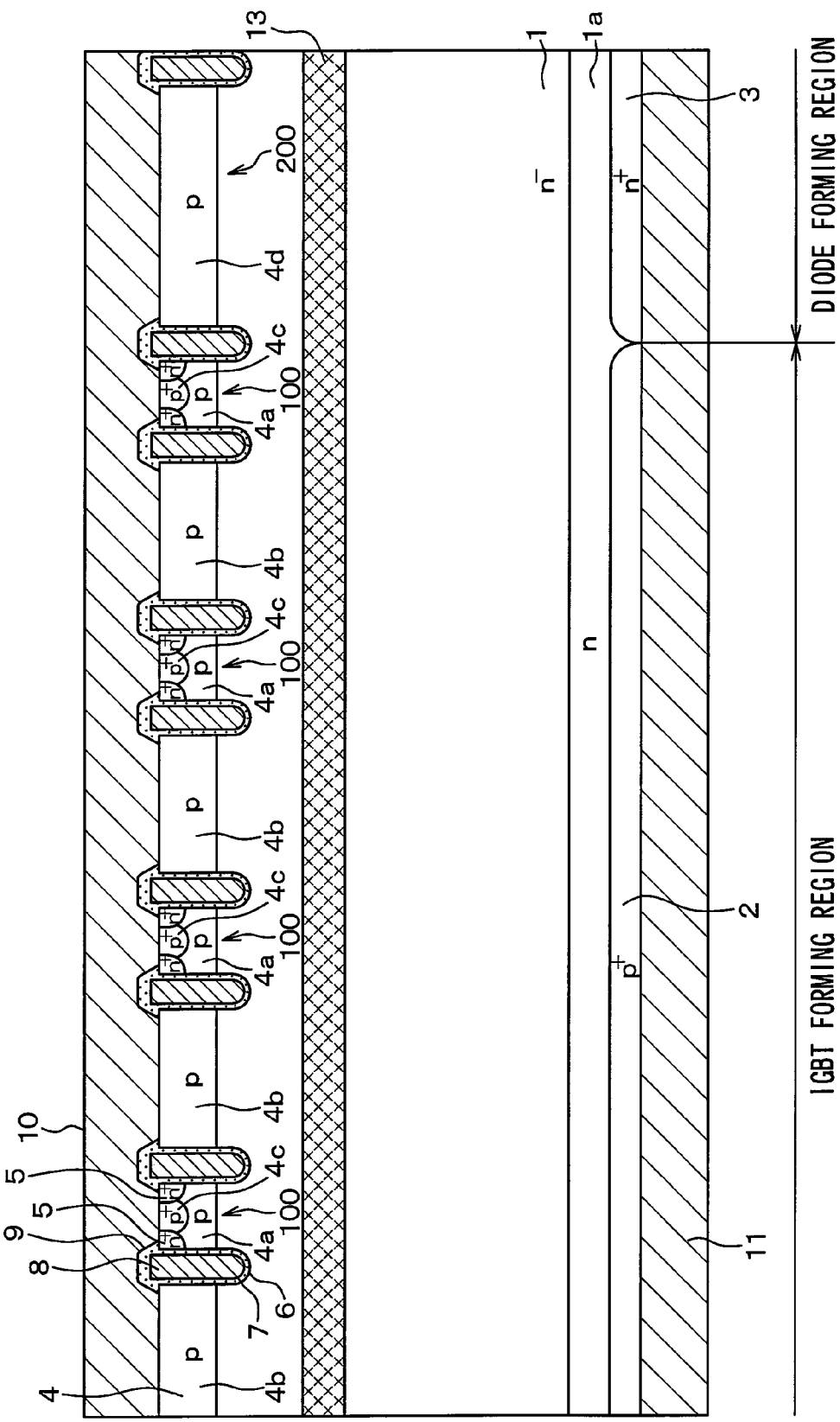
FIG. 14 is a cross-sectional view of a semiconductor device according to a seventh embodiment of the present disclosure.

As shown in FIG. 14, the semiconductor device according to the present embodiment includes a He-ray irradiation region 13 in the n$^-$-type drift layer 1. The He-ray irradiation region 13 is formed by irradiation with a He-ray from the surface of the substrate. The He-ray irradiation region 13 includes lifetime killers such as crystal defects.

By forming the He-ray irradiation region 13, a lifetime can be controlled with the lifetime killers. Thus, the recovery loss can be reduced compared with the first embodiment.

(Eighth Embodiment)

A semiconductor device according to a ninth embodiment of the present disclosure will be described. In the present embodiment, the semiconductor device further includes an electron ray irradiation region with respect to the first embodiment, and the other part is similar to the first embodiment. Thus, only a part different the first embodiment will be described.

Figure 15:
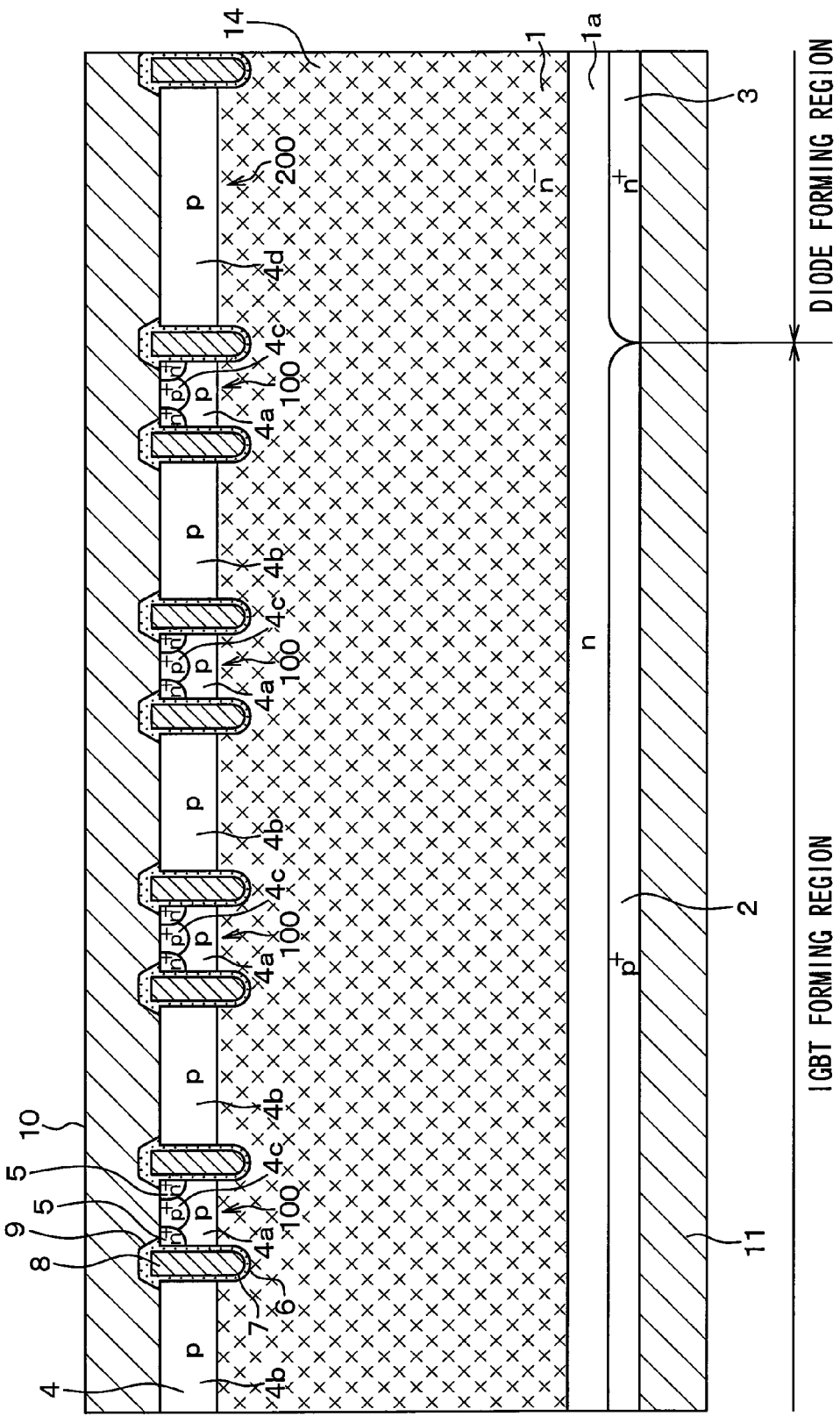
FIG. 15 is a cross-sectional view of a semiconductor device according to an eighth embodiment of the present disclosure.

As shown in FIG. 15, the semiconductor device according to the present embodiment includes an electron ray irradiation region 14 in the n$^-$-type drift layer 1. The electron ray irradiation region 14 is formed by irradiation with an electron ray from the surface of the substrate. The electron ray irradiation region 14 includes lifetime killers such as crystal defects.

By forming the electron ray irradiation region 14, a lifetime can be controlled with the lifetime killers. Thus, the recovery loss can be reduced compared with the first embodiment.

(Other Embodiments)

In the above-described embodiments, the n-type regions 20 are formed in the thinned-out sections in the IGBT forming region, the n-type regions 30 are disposed in the IGBT operating section in the IGBT forming region, or the n-type regions 21 is formed in the diode forming region. The above-described configurations may be combined appropriately. Two or three of the above-described regions may be formed in one semiconductor device.

In each of the above-described embodiments, the n channel type IGBT, in which the first conductivity type is n-type and the second conductivity type is p-type, is described as an example. The above-described configurations may also be applied to a p channel type IGBT in which a conductivity type of each part is reversed. In such a case, conductivity types of elements other than IGBT are also reversed.

What is claimed is:

1. A semiconductor device that includes an IGBT forming region and a diode forming region disposed along the IGBT forming region, the IGBT forming region including a vertical IGBT and the diode forming region including a diode, the semiconductor device comprising:
    a drift layer of a first conductivity type having a first surface and a second surface;
    a collector region of a second conductivity type disposed to the second surface of the drift layer in the IGBT forming region;
    a cathode region of the first conductivity type disposed to the second surface of the drift layer in the diode forming region;
    a second conductivity type region disposed to the first surface of the drift layer in both of the IGBT forming region and the diode forming region;
    a plurality of trenches extending to a depth deeper than the second conductivity type region, the trenches dividing the second conductivity type region in the IGBT forming region into a plurality of regions including a channel region and a first anode region;
    an emitter region of the first conductivity type disposed at a surface portion of the channel region along sidewalls of the trenches in the IGBT forming region;
    a gate insulating layer disposed on surfaces of the trenches;
    a gate electrode disposed on a surface of the gate insulating layer;
    an upper electrode electrically coupled with the second conductivity type region in the IGBT forming region including the channel region and the first anode region, the upper electrode further electrically coupled with the second conductivity type region in the diode forming region which operates as a second anode region; and
    a lower electrode electrically coupled with the collector region in the IGBT forming region and the cathode region in the diode forming region, wherein
    in the IGBT forming region, a section including the channel region is an IGBT operating section that operates as the vertical IGBT, and a section including the first anode region is a thinned-out section that does not operate as the vertical IGBT,
    when an area density is defined as a value calculated by integrating a concentration profile of second conductivity type impurities in the second conductivity type region in a depth direction, an area density of the channel region is higher than an area density of the first anode region and an area density of the second anode region, and
    a ratio of an area of the first anode region to an area of the IGBT forming region is greater than or equal to 13% and less than 100%.

2. A semiconductor device that includes an IGBT forming region and a diode forming region disposed along the IGBT forming region, the IGBT forming region including a vertical IGBT and the diode forming region including a diode, the semiconductor device comprising:
    a drift layer of a first conductivity type having a first surface and a second surface;
    a collector region of a second conductivity type disposed to the second surface of the drift layer in the IGBT forming region;
    a cathode region of the first conductivity type disposed to the second surface of the drift layer in the diode forming region;
    a second conductivity type region disposed to the first surface of the drift layer in both of the IGBT forming region and the diode forming region;
    a plurality of trenches extending to a depth deeper than the second conductivity type region, the trenches dividing the second conductivity type region in the IGBT forming region into a plurality of regions including a channel region and a first anode region;
    an emitter region of the first conductivity type disposed at a surface portion of the channel region along sidewalls of the trenches in the IGBT forming region;
    a gate insulating layer disposed on surfaces of the trenches;
    a gate electrode disposed on a surface of the gate insulating layer;
    an upper electrode electrically coupled with the second conductivity type region in the IGBT forming region including the channel region and the first anode region, the upper electrode further electrically coupled with the second conductivity type region in the diode forming region which operates as a second anode region; and a lower electrode electrically coupled with the collector region in the IGBT forming region and the cathode region in the diode forming region;

a first conductivity type region disposed at a middle portion of the first anode region in a depth direction and coupled with the trenches located on both sides of the first anode region, wherein in the IGBT forming region, a section including the channel region is an IGBT operating section that operates as the vertical IGBT, and a section including the first anode region is a thinned-out section that does not operate as the vertical IGBT, when an area density is defined as a value calculated by integrating a concentration profile of second conductivity type impurities in the second conductivity type region in a depth direction, an area density of the channel region is higher than an area density of the first anode region and an area density of the second anode region, and a ratio of an area of the first anode region to an area of the IGBT forming region is greater than or equal to 13% and less than 100%.

3. The semiconductor device according to claim 1, further comprising a first conductivity type region disposed at a bottom portion of the channel region and a boundary portion between the channel region and the drift layer, the first conductivity type region and coupled with the trenches located on both sides of the channel region.

4. The semiconductor device according to claim 1, wherein the second conductivity type region in the IGBT forming region includes the first anode region close to the diode forming region and the first anode region close to a center portion of the IGBT forming region, and a width of the first anode region close to the diode forming region is larger than a width of the first anode region close to the center portion of the IGBT forming region.

5. The semiconductor device according to claim 2, further comprising a first conductivity type region disposed at a bottom portion of the channel region and a boundary portion between the channel region and the drift layer, the first conductivity type region and coupled with the trenches located on both sides of the channel region.

6. The semiconductor device according to claim 2, wherein the second conductivity type region in the IGBT forming region includes the first anode region close to the diode forming region and the first anode region close to a center portion of the IGBT forming region, and a width of the first anode region close to the diode forming region is larger than a width of the first anode region close to the center portion of the IGBT forming region.

* * * * *